(12) United States Patent
Maeda et al.

(10) Patent No.: US 10,295,597 B2
(45) Date of Patent: May 21, 2019

(54) SEMICONDUCTOR DEVICE AND SCAN TEST METHOD INCLUDING WRITING AND READING TEST DATA

(71) Applicant: Renesas Electronics Corporation, Tokyo (JP)

(72) Inventors: Yoichi Maeda, Kodaira (JP); Jun Matsushima, Kodaira (JP); Hiroki Wada, Kodaira (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/549,624

(22) PCT Filed: Apr. 16, 2015

(86) PCT No.: PCT/JP2015/002100
§ 371 (c)(1),
(2) Date: Aug. 8, 2017

(87) PCT Pub. No.: WO2016/166780
PCT Pub. Date: Oct. 20, 2016

(65) Prior Publication Data
US 2018/0059183 A1    Mar. 1, 2018

(51) Int. Cl.
*G01R 31/319* (2006.01)
*G01R 31/3185* (2006.01)
(Continued)

(52) U.S. Cl.
CPC ... *G01R 31/31921* (2013.01); *G01R 31/3193* (2013.01); *G01R 31/31922* (2013.01);
(Continued)

(58) Field of Classification Search
CPC ........ G01R 31/31921; G01R 31/31922; G01R 31/3193; G01R 31/318516;
(Continued)

(56) References Cited

U.S. PATENT DOCUMENTS 7,366,803 B1 * 4/2008 Gaither ................. H04L 12/433
370/363
7,555,690 B1    6/2009 Yang et al.
(Continued)

FOREIGN PATENT DOCUMENTS

| JP | 2723957 B2 | 3/1998 |
| JP | 2000-321331 A | 11/2000 |
| JP | 2008-530549 A | 8/2008 |

OTHER PUBLICATIONS

R. W. Apperson, Z. Yu, M. J. Meeuwsen, T. Mohsenin and B. M. Baas, "A Scalable Dual-Clock FIFO for Data Transfers Between Arbitrary and Haltable Clock Domains," in IEEE Transactions on Very Large Scale Integration (VLSI) Systems, vol. 15, No. 10, pp. 1125-1134, Oct. 2007.*

(Continued)

*Primary Examiner* — Cynthia Britt
(74) *Attorney, Agent, or Firm* — McGinn I.P. Law Group, PLLC.

(57) ABSTRACT

A semiconductor device includes a FIFO, a test data write circuit that sequentially writes a plurality of test data to the FIFO in synchronization with a first clock signal, and a test control circuit that, in parallel with writing of the plurality of test data to the FIFO by the test data write circuit, sequentially reads a plurality of test data stored in the FIFO in synchronization with a second clock signal that is not synchronous with the first clock signal and performs a scan test of a circuit to be tested.

15 Claims, 20 Drawing Sheets

(51) Int. Cl.
*G01R 31/3193* (2006.01)
*G06F 11/267* (2006.01)

(52) U.S. Cl.
CPC ............ *G01R 31/318508* (2013.01); *G01R 31/318516* (2013.01); *G01R 31/318547* (2013.01); *G01R 31/318594* (2013.01); *G06F 11/267* (2013.01)

(58) Field of Classification Search
CPC .... G01R 31/318508; G01R 31/318594; G01R 31/28; G06F 11/267
See application file for complete search history.

(56) References Cited

U.S. PATENT DOCUMENTS

| | | | | |
|---|---|---|---|---|
| 7,574,635 | B1* | 8/2009 | Alfke | G11C 29/56 710/52 |
| 2002/0141525 | A1* | 10/2002 | Behrens | G01R 31/31935 375/372 |
| 2007/0234157 | A1* | 10/2007 | Rajski | G01R 31/318547 714/728 |
| 2007/0266284 | A1 | 11/2007 | Chelstrom et al. | |
| 2009/0129183 | A1* | 5/2009 | Priel | G01R 31/318552 365/201 |
| 2010/0188096 | A1 | 7/2010 | Waayers et al. | |
| 2012/0232825 | A1 | 9/2012 | Patil et al. | |
| 2013/0336077 | A1* | 12/2013 | Matsui | G11C 7/1078 365/201 |
| 2014/0229778 | A1 | 8/2014 | Tekumalla et al. | |

OTHER PUBLICATIONS

C. Hastings, "FIFO flag timing: marching to two different drummers," Proceedings of WESCON '93, San Francisco, CA, USA, 1993, pp. 563-570.*

H. Iwata, Y. Maeda, J. Matsushima and M. Takakura, "An Effective At-Speed Scan Testing Approach Using Multiple-Timing Clock Waveforms," 2012 IEEE 21st Asian Test Symposium, Niigata, 2012, pp. 1-1.*

International Search Report (ISR) (PCT Form PCT/ISA/210), in PCT/JP2015/002100, dated Jul. 7, 2015.

Japanese Office Action dated May 22, 2018 in corresponding Japanese Patent Application No. 2017-512467 with a partial English translation thereof.

Extended European Search Report dated Oct. 17, 2018, in counterpart European Patent Application No. 15889119.2.

* cited by examiner

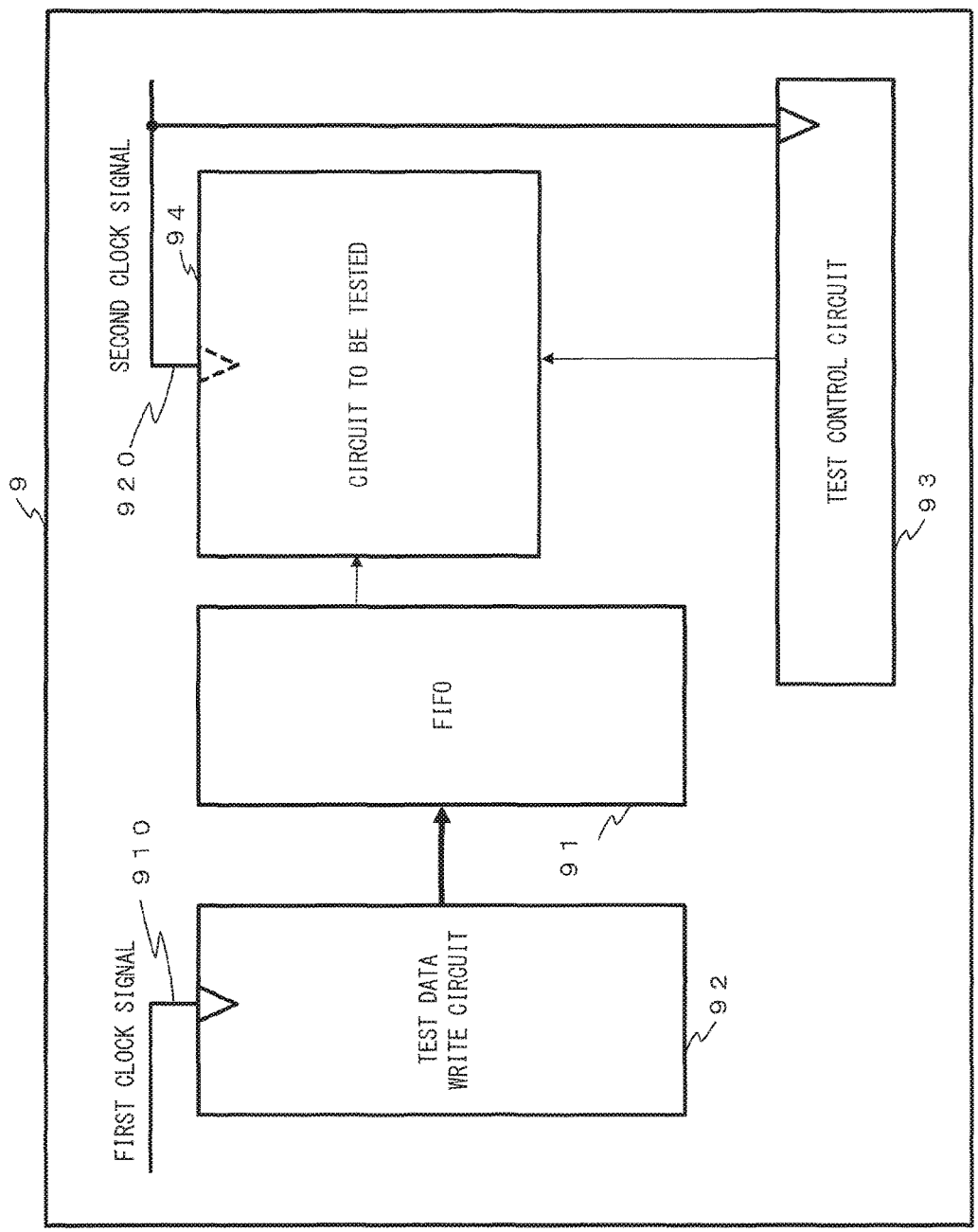

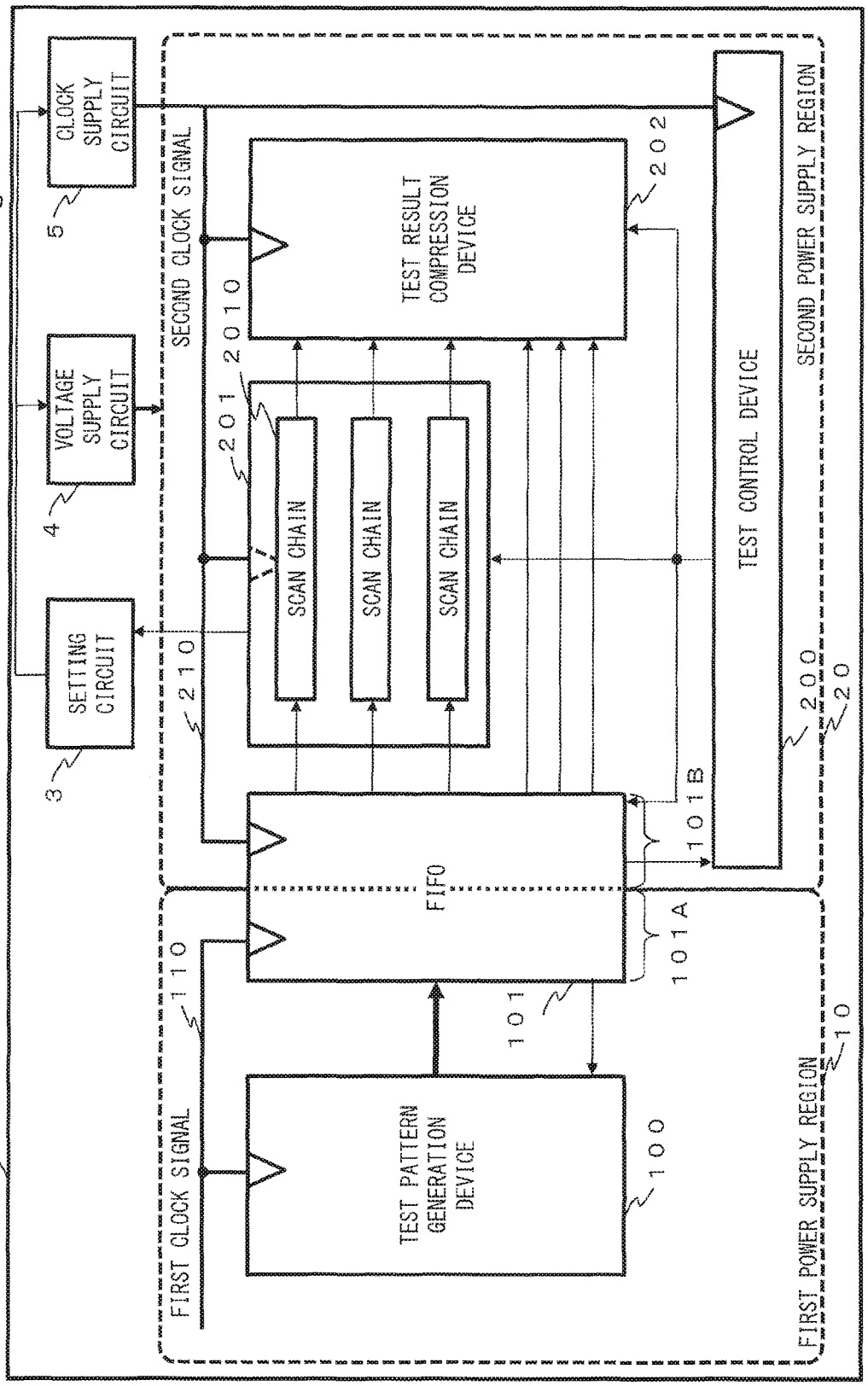

SEMICONDUCTOR DEVICE AND SCAN TEST METHOD INCLUDING WRITING AND READING TEST DATA

TECHNICAL FIELD

The present invention relates to a semiconductor device and a scan test method and, particularly, relates to a semiconductor device including circuits that operate in synchronization with different clock signals.

TECHNICAL FIELD

A scan test is typically used as a test of a semiconductor device. A semiconductor device capable of performing a scan test has a scan chain, which is a shift register. The shift register is constructed by connecting flip-flops that forma logic. A scan test is performed by inputting test data to a flip-flop in the first stage of the scan chain.

In general, the scan chain is split into a plurality of segments in order to reduce the time needed for a scan test. Each of the scan chains has an input for taking test data in and an output for taking test results out. Test results are sequentially taken out of the flip-flop in the final stage of the scan chain and checked against an expected value, and thereby the test results of the scan test are determined.

As is obvious from the above operation, for a scan test, it is necessary to simultaneously supply a plurality of test data to a plurality of scan chains in synchronization with a clock at a constant rate. Further, for a scan test, it is necessary to successively supply a plurality of test data to the respective scan chains in synchronization with a clock at a constant rate. "In synchronization with a clock" means to allow test data to propagate to a flip-flop in the next stage in one clock cycle for a scan chain (2010) to perform a scan shift operation, without causing setup time violations and hold-time violations. When supply of test data to a plurality of scan chains does not satisfy the above condition, it is not possible to supply correct test data to all flip-flops and thereby not possible to take out correct test results stably.

However, in a runtime test mechanism that includes a circuit which performs the above-described scan test, timing design is difficult in some cases. An example of the case where timing design is difficult is when STA (Static Timing Analysis) cannot be carried out (it is virtually impossible due to too complicated conditions) in the case where a CPU (Central Processing Unit) core is located in a DVFS (Dynamic Voltage and Frequency Scaling) region (region where the voltage and frequency vary) and a circuit for controlling a runtime test is located in a CONST region (region where the voltage and frequency do not vary).

It may be possible to avoid the above problem by easing the constraints on transmission timing (i.e., reducing the processing rate of a circuit) and allowing for a sufficient timing margin. However, this results in a failure to satisfy requirements (e.g., completion of a runtime test in 10 msec) related to a runtime test execution time (FTTI: fault tolerant time interval).

To address the problem that clock synchronous design is not done in a plurality of flip-flops that form a scan chain, Patent Literature 1 discloses a technique that avoids hold-time violations by inserting a delay circuit into a transmission path between flip-flops where there is a difference in clock timing. Further, Patent Literature 2 discloses a technique that avoids hold-time violations by inserting a latch into a scan cell between a first clock region and a second clock region.

As described above, solutions for the case where a plurality of clocks are not synchronous with each other, and a hold time cannot be guaranteed due to the lag in transmission of those clocks are disclosed in Patent Literature 1 and Patent Literature 2. However, in the techniques disclosed in Patent Literature 1 and Patent Literature 2, setup time violations cannot be avoided while hold-time violations can be avoided. There is thus a problem that it is not possible to perform a scan test without the occurrence of timing violations.

Further, to address the problem that clock synchronization settings are not done, Patent Literature 3 discloses a technique that accumulates all scan-in data in a FIFO (First In First Out) in synchronization with a low-rate scan clock and then supplies the accumulated scan-in data in the FIFO in synchronization with a high-rate system clock. However, in the technique disclosed in Patent Literature 3, a scan test can be performed only after all the scan-in data are loaded at a low-rate scan clock, and therefore it has a problem that the time needed for a scan test increases.

CITATION LIST

Patent Literature

PTL1: Japanese Unexamined Patent Application Publication No. 2000-321331
PTL2: Japanese Unexamined Patent Application Publication No. 2008-530549
PTL3: Japanese Patent No. 2723957

SUMMARY OF INVENTION

Technical Problem

As described above, the techniques disclosed in Patent Literature 1 and Patent Literature 2 have a problem that it is not possible to perform a scan test without the occurrence of timing violations. Further, the technique disclosed in Patent Literature 3 has a problem that the time needed for a scan test increases.

The other problems and novel features of the present invention will become apparent from the description of the specification and the accompanying drawings.

Solution to Problem

According to one embodiment, in parallel with writing of a plurality of test data to a FIFO in synchronization with a first clock signal, a semiconductor device sequentially reads a plurality of test data stored in the FIFO in synchronization with a second clock signal, which is not synchronous with the first clock signal, and performs a scan test of a circuit to be tested.

Advantageous Effects of Invention

According to one embodiment described above, it is possible to perform a scan test with the reduced occurrence of timing violations and in a shorter execution time.

BRIEF DESCRIPTION OF DRAWINGS

FIG. 19 is a schematic diagram of a semiconductor device according to a seventh embodiment.

FIG. 20 is a schematic diagram of a semiconductor device according to another embodiment.

DESCRIPTION OF EMBODIMENTS

Preferred embodiments of the present invention will be described hereinafter with reference to the drawings. It should be noted that specific numerical values and the like in the following embodiments are given merely for illustrative purposes, and values are not limited thereto unless particularly noted. Further, in the following description and drawings, things that are obvious to those skilled in the art and the like are appropriately omitted, shortened and simplified to clarify the explanation.

First Embodiment

[Overall Configuration]

Figure 1:
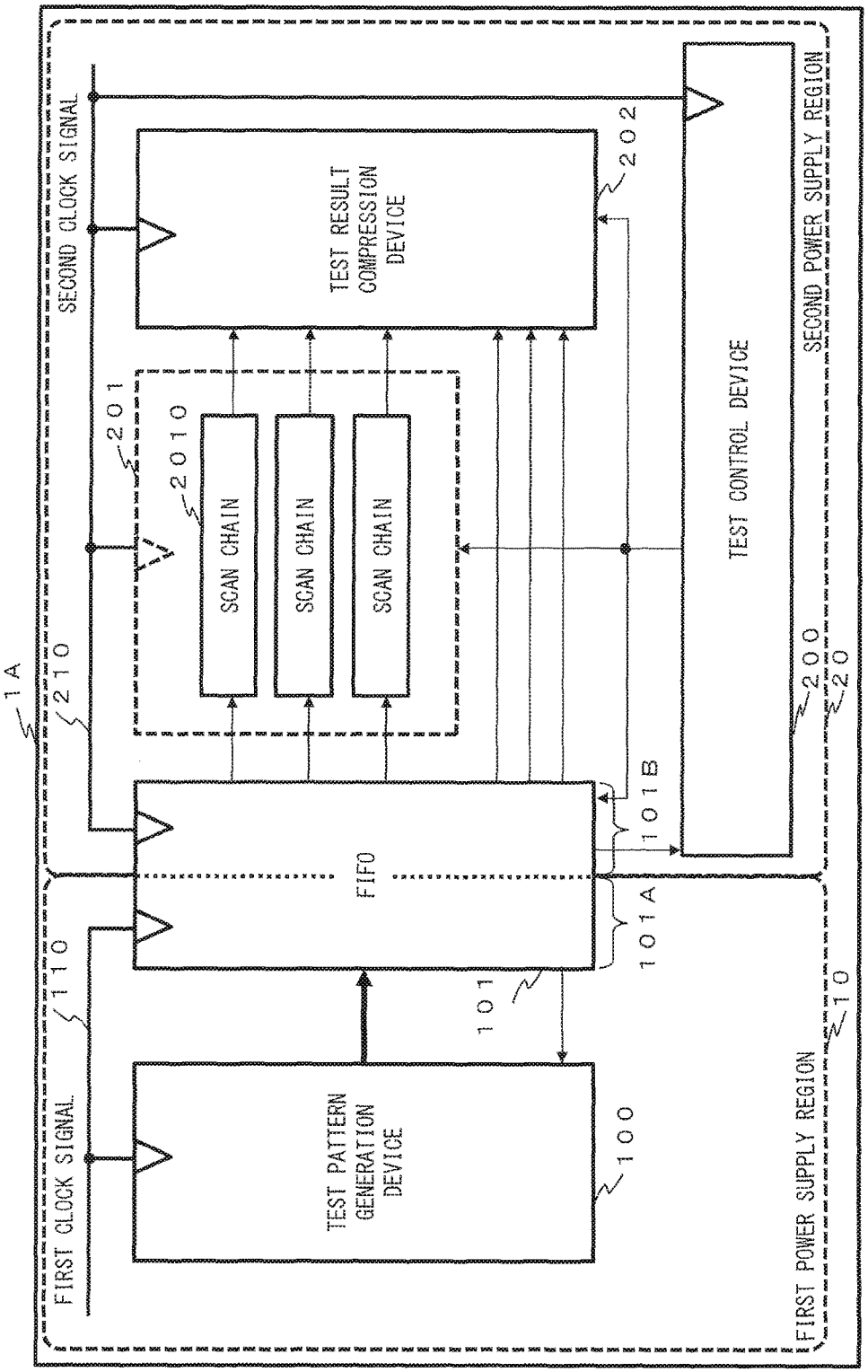
FIG. 1 is a first schematic diagram of a semiconductor device according to a first embodiment.

The configuration of a semiconductor device (1A) according to the first embodiment is described hereinafter with reference to FIG. 1. FIG. 1 is a block diagram of the semiconductor device (1A) according to the first embodiment.

As shown in FIG. 1, the semiconductor device (1A) includes a test pattern generation device (100), a FIFO (101), a test control device (200), a circuit to be tested (201), and a test result compression device (202). The semiconductor device (1A) includes a first power supply region (10) and a second power supply region (20), and power supply lines are different between the first power supply region (10) and the second power supply region (20).

A first power supply region (10) includes the test pattern generation device (100). A second power supply region (20) includes the test control device (200), the circuit to be tested (201), and the test result compression device (202). Some functional block (101A) in the FIFO (101) is included in the first power supply region (10), and the remaining functional block (101B) are included in the second power supply region (20). Note that the detailed description of the functional blocks in the FIFO (101) will be provided later on.

Power supply lines are different between the first power supply region (10) and the second power supply region (20). Specifically, different power supply voltages are supplied independently of each other to the first power supply region (10) and the second power supply region (20). It is assumed that the first power supply region (10) is the CONST region, and the second power supply region (20) is the DVFS region, for example.

Devices and circuits that are placed in the first power supply region (10) are driven by a first clock signal (110). Devices and circuits that are placed in the second power supply region (20) are driven by a second clock signal (210). In the FIFO (101) also, some functional block (101A) is driven by the first clock signal (110), and the remaining functional block (101B) is driven by a second clock signal (210).

The first clock signal (110) and the second clock signal (210) are not synchronous (at least one of the frequency and the phase is different) since voltages are different between the first power supply region (10) and the second power supply region (20). Note that, alternatively, the first clock signal (110) and the second clock signal (210) may be asynchronous since they are clock signals generated by different clock generation circuits.

The test pattern generation device (100) is electrically connected to the FIFO (101). The test pattern generation device (100) is a circuit that sequentially stores a plurality of scan test data to be used for a scan test of the circuit to be tested (201) into the FIFO (101).

The FIFO (101) is a storage device (storage circuit) that can store a plurality of scan test data. The FIFO (101) temporarily stores the scan test data output from the test pattern generation device (100) and then outputs them to the circuit to be tested (201).

The circuit to be tested (201) is a functional logic (logic circuit) that controls the semiconductor device (1A). The circuit to be tested (201) is a CPU, for example. The circuit to be tested (201) has undergone processing for enabling scanning in accordance with a scan test technique. Specifically, the circuit to be tested (201) has a plurality of scan chains (2010). In FIG. 1, each of the scan chains (2010) is a block schematically showing that its functional logic (the circuit to be tested (201)) is scan-enabled.

The FIFO (101) is electrically connected to the first stage (input stage) of each scan chain (2010) so as to supply scan test data to the circuit to be tested (201). The last stage (output stage) of each scan chain (2010) is electrically connected to the test result compression device (202) so as to acquire data, which is operation results by the scan test data, from the circuit to be tested (201).

The circuit to be tested (201) thereby stores the scan test data output from the FIFO (101) into each of the scan chains (2010). Further, after operation by the scan test data, the circuit to be tested (201) outputs data, which is operation results, stored in each of the scan chains (2010) as test result data to the test result compression device (202).

Figure 2:
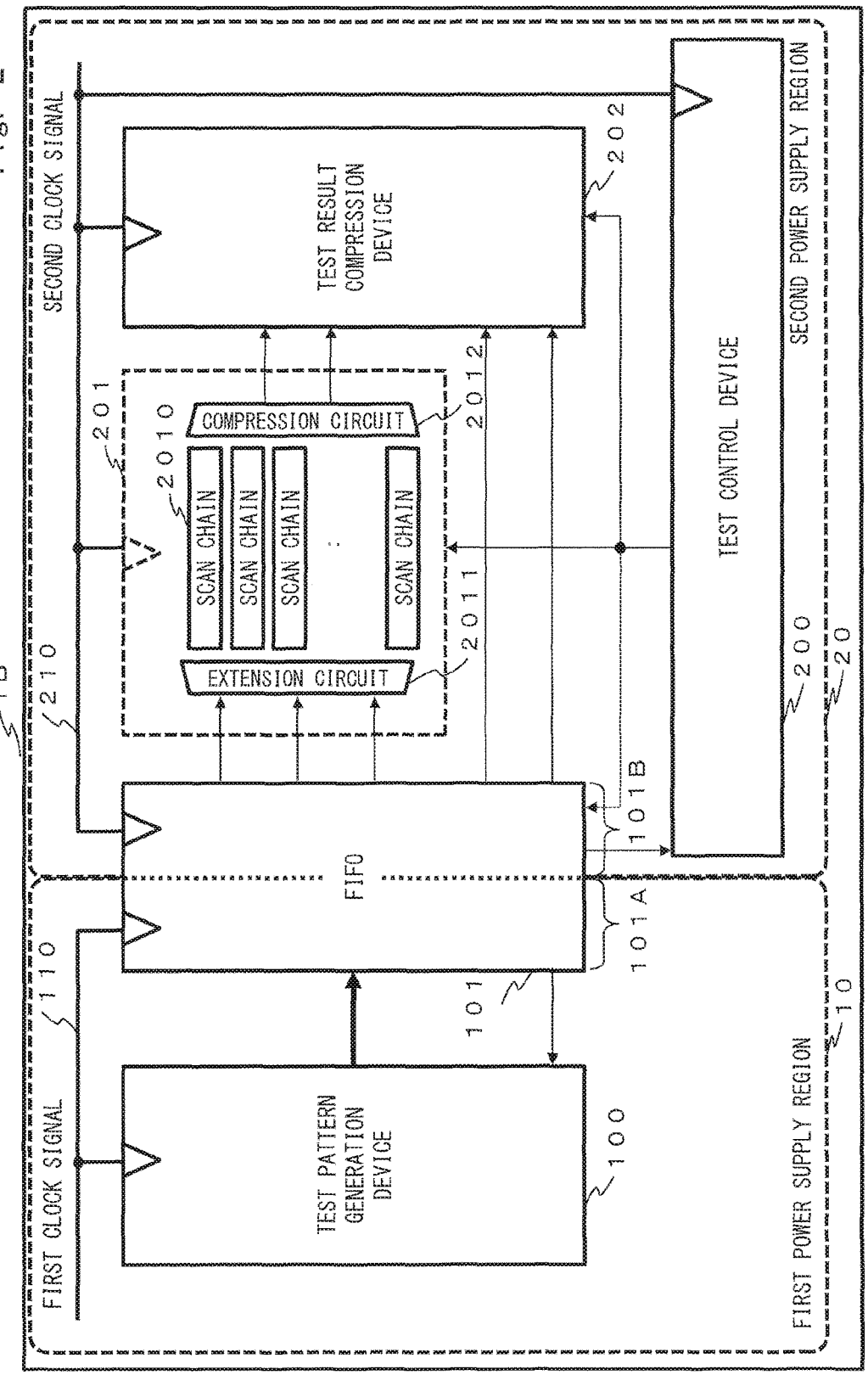
FIG. 2 is a second schematic diagram of the semiconductor device according to the first embodiment.

Note that, although an example of a simple scan enable configuration is shown in FIG. 1, the circuit to be tested (201) may further include an extension circuit (2011) and a compression circuit (2012), like a semiconductor device (1B) shown in FIG. 2. Stated differently, the circuit to be tested (201) may have a configuration using compressed scan. In this case, the FIFO (101) is electrically connected to the first stage of each scan chain (2010) through the extension circuit (2011). Further, the last stage of each scan chain (2010) is electrically connected to the test result compression device (202) through the compression circuit (2012).

The extension circuit (2011) extends the scan test data output from the FIFO (101) to the same number of bits as the number of scan chains (2010) and then stores them into each of the scan chains (2010). The compression circuit (2012) compresses test result data stored in each of the scan chains (2010) to a smaller number of bits and outputs them to the test result compression device (202).

The test control device (200) is electrically connected to the FIFO (101), the circuit to be tested (201) and the test result compression device (202) so as to control those circuits (101, 201) and device (202).

The test result compression device (202) generates a compressed code from a plurality of test result data sequentially output from the circuit to be tested (201). Further, the test result compression device (202) determines test results based on the generated compressed code.

[Test Pattern Generation Device (100)]

The test pattern generation device (100) shown in FIG. 1 is a device (circuit) that writes a plurality of scan test data for performing a scan test of the circuit to be tested (201) into the FIFO (101) in the order of shift cycle. The scan test data may be prestored in the semiconductor device (1A). For example, the scan test data may be prestored in a FLASH memory included in the semiconductor device (1A), for example. Alternatively, the scan test data may be supplied from the outside of the semiconductor device (1A). To be more specific, ATE (Automated Test Equipment) may be connected to the semiconductor device (1A), and the scan test data may be supplied from the ATE. The test pattern generation device (100) writes the scan test data supplied from the ATE into the FIFO (101). In this case, the first clock signal (110) may be supplied from the ATE. Further, the semiconductor device (1A) may be configured not to include the test pattern generation device (100), and the scan test data may be directly written from the ATE the FIFO (101).

[FIFO (101)]

Figure 3:
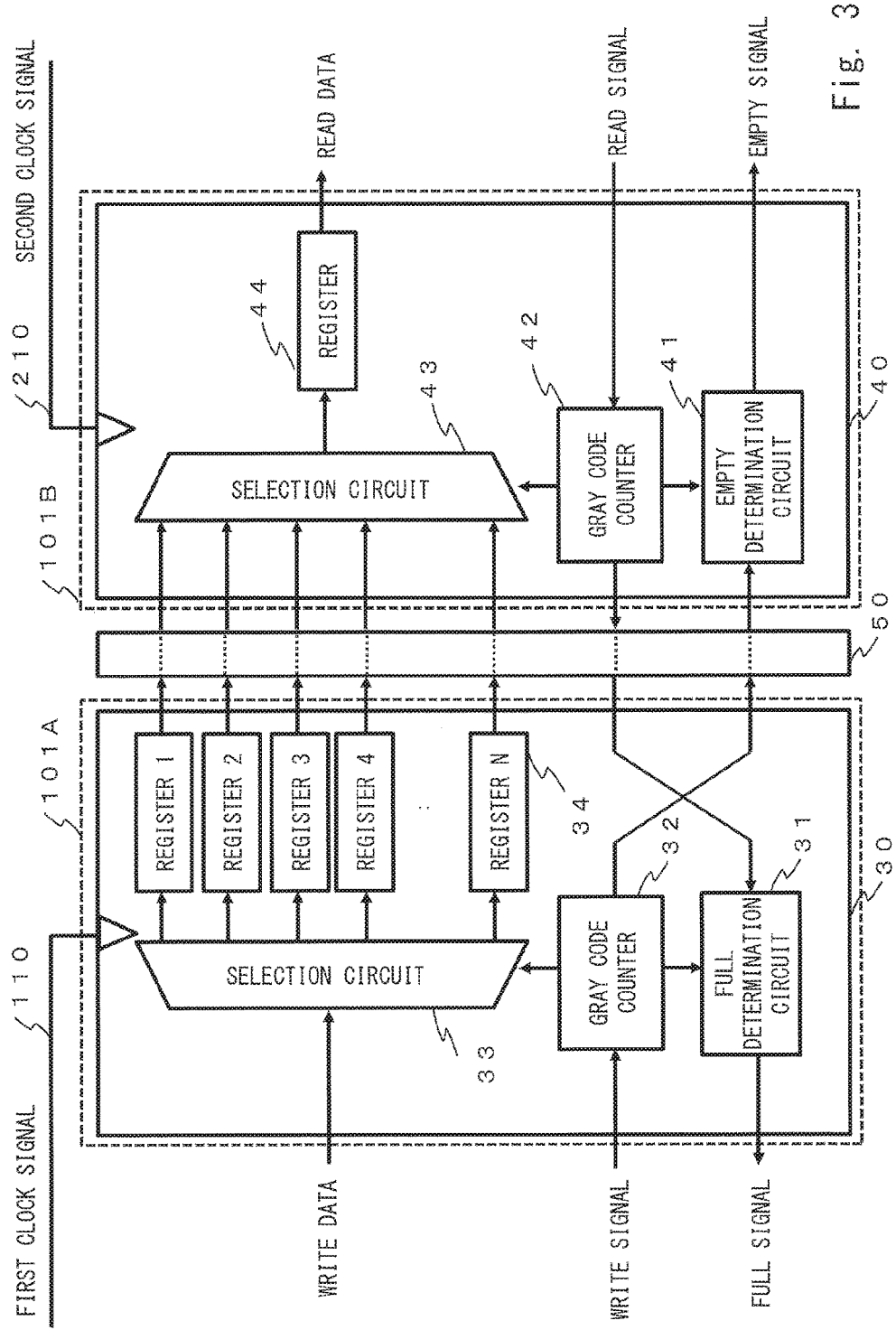
FIG. 3 is a schematic diagram of a FIFO shown in FIG. 1.

The configuration of the FIFO (101) according to the first embodiment is described hereinafter with reference to FIG. 3. FIG. 3 is a block diagram of the FIFO (101) according to the first embodiment.

As shown in FIG. 3, the FIFO (101) includes an input circuit (30) and an output circuit (40). As described above, the FIFO (101) has broadly two functional blocks (101A, 101B). One is a functional block for writing (101A), which includes the input circuit (30). The other one is a functional block for reading (101B), which includes the output circuit (40). The input circuit (30) is a circuit that writes write data (scan test data) input from the test pattern generation device (100) into the FIFO (101). The output circuit (40) is a circuit that reads data from the FIFO (101) and outputs it as read data to the circuit to be tested (201).

A boundary circuit (50) is placed between the input circuit (30) and the output circuit (40) in some cases. The boundary circuit (50) includes a level shifter (not shown) for absorbing a potential difference between the first power supply region (10) and the second power supply region (20) and an isolation logic (not shown) for cutting off power supply at the boundary.

The input circuit (30) includes a full determination circuit (31), a gray code counter (32), a selection circuit (33), and a register group (34).

The full determination circuit (31) determines whether the register group (34) is full or not based on gray codes output from each of the gray code counter (32) and a gray code counter (42). In other words, the full determination circuit (31) determines whether scan test data is stored in all registers of the register group (34). When the full determination circuit (31) determines that the register group (34) is full, it asserts a full signal to be output to the test pattern generation device (100). On the other hand, when the full determination circuit (31) determines that the register group (34) is not full, it negates a full signal to be output to the test pattern generation device (100).

Thus, when the full signal that is input from the full determination circuit (31) is asserted, the test pattern generation device (100) stops the input of the scan test data to the FIFO (101). It is thereby possible to prevent overflow of the FIFO (101). On the other hand, when the full signal that is input from the full determination circuit (31) is negated, the test pattern generation device (100) inputs the scan test data to the FIFO (101).

The gray code counter (32) stores a gray code indicating the address of a register in the register group (34) to which write data is to be written. The gray code counter (32) outputs the gray code stored in itself to the full determination circuit (31), the selection circuit (33) and an empty determination circuit (41). Further, during the period when the write signal that is input from the test pattern generation device (100) is asserted, the gray code counter (32) updates the gray code stored in itself in synchronization with the first clock signal (110). Specifically, during the period when the write signal is asserted, the gray code counter (32) updates the gray code stored in itself each time the edge of the first clock signal (110) is input.

Note that, during the period when the scan test data is input to the FIFO (101), the test pattern generation device (100) outputs the asserted write signal to the gray code counter (32), and during the period when the input of the scan test data to the FIFO (101) is stopped, the test pattern generation device (100) outputs the negated write signal to the gray code counter (32).

The selection circuit (33) selects one register in the register group (34) which is indicated by the gray code output from the gray code counter (32) as a register to which write data is to be written. Thus, during the period when the write signal is asserted, a register selected by the selection circuit (33) is switched in synchronization with the first clock signal (110). In FIG. 3, a plurality of registers included in the register group (34) are shown as "register 1", ..., "register N" (N is any predetermined positive integer). The gray code counter (32) switches the register selected from a plurality of registers in the register group (34) in a cyclic fashion (e.g., in the order of "register 1", ..., "register N", "register 1", ...), for example.

The register group (34) stores write data (scan test data). The register group (34) includes a plurality of registers. Each register in the register group (34) has a size capable of storing the scan test data of one shift cycle. For example, when the size of the scan test data (write data, read data) is 6 bits, the size of each register in the register group (34) is 6 bits. By preparing a plurality of registers in this manner, it is possible to write data into another register while data of a certain register among a plurality of registers in the register group (34) is being read.

The output circuit (40) includes the empty determination circuit (41), the gray code counter (42), a selection circuit (43), and a register (44).

The empty determination circuit (41) determines whether the register group (34) is empty or not based on the gray code output from each of the gray code counter (32) and the gray code counter (42). In other words, the empty determination circuit (41) determines whether data is not stored in any of all registers in the register group (34). When the empty determination circuit (41) determines that the register group (34) is empty, it asserts an empty signal to be output to the test control device (200). On the other hand, when the empty determination circuit (41) determines that the register group (34) is not empty, it negates an empty signal to be output to the test control device (200).

The gray code counter (42) stores a gray code indicating the address of a register in the register group (34) from which read data is to be read. The gray code counter (42) outputs the gray code stored in itself to the full determination circuit (31), the empty determination circuit (41) and the selection circuit (43). Further, during the period when the read signal that is input from the test control device (200) is asserted, the gray code counter (42) updates the gray code stored in itself in synchronization with the second clock signal (210). Specifically, during the period when the read signal is asserted, the gray code counter (42) updates the gray code stored in itself each time the edge of the second clock signal (210) is input. Note that a scan enable signal, which is described later, serves as the read signal.

The selection circuit (43) selects one register in the register group (34) which is indicated by the gray code output from the gray code counter (42) as a register from which read data is to be read. Thus, during the period when the read signal is asserted, a register selected by the selection circuit (43) is switched in synchronization with the second clock signal (210). The gray code counter (42), like the gray code counter (32), switches the register selected from a plurality of registers in the register group (34) in a cyclic fashion, for example.

The scan test data stored in the register selected by the selection circuit (43) from the register group (34) is read and stored into the register (44) in synchronization with the second clock signal (210). The scan test data stored in the register (44) is output, as read data, to the circuit to be tested (201) and the test result compression device (202). The circuit to be tested (201) can thereby read the scan test data sequentially stored in the register (44) in synchronization with the second clock signal (210).

As described above, the register group (34) included in the input circuit (30) is driven by the first clock signal (110), and the register (44) included in the output circuit (40) is driven by the second clock signal (210). Thus, the input circuit (30) and the output circuit (40) do not need to be synchronized by the same clock.

Note that, as described above, the gray code counter (32) and the gray code counter (42) switch the selection of a plurality of registers in the register group (34) in a cyclic fashion in the same order. Thus, the full determination circuit (31) determines that the FIFO (101) is full when the register indicated by the gray code output from the gray code counter (32) is a register immediately before the register indicated by the gray code output from the gray code counter (42) and, otherwise, determines that the FIFO (101) is not full. Further, the empty determination circuit (41) determines that the FIFO (101) is empty when the register indicated by the gray code output from the gray code counter (32) and the register indicated by the gray code output from the gray code counter (42) are the same register, and determines that the FIFO (101) is not empty when they are not the same register.

An input example of the scan test data to the circuit to be tested (201) and the test result compression device (202) is described hereinafter with reference to FIG. 4. Note that FIG. 4 shows an input example of the scan test data in the semiconductor device (1B) shown in FIG. 2.

Figure 4:
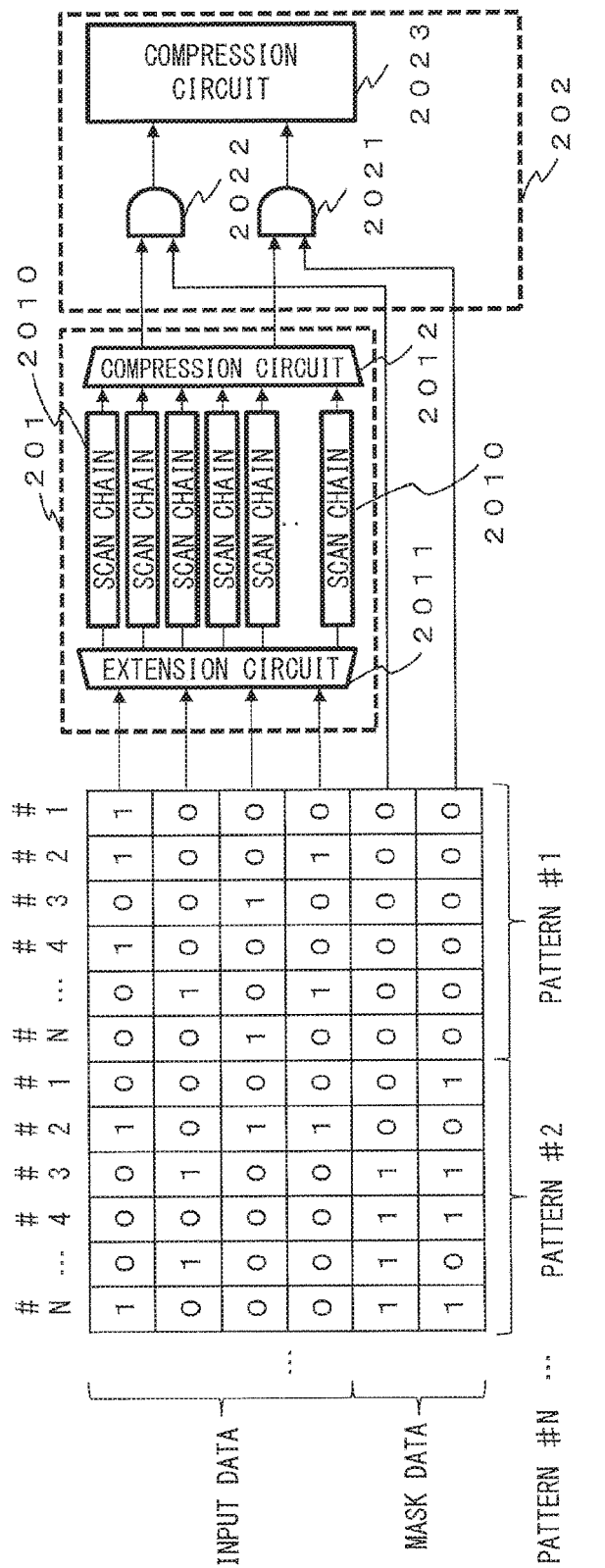
FIG. 4 is a diagram showing an example of test data stored in the FIFO shown in FIG. 2.

The data shown in the left part of FIG. 4 is one schematically showing the content of the scan test data stored in the FIFO (101) shown in FIG. 3 in a tabular form. In this table, the scan test data are arranged sequentially from the right in the order of being stored into the FIFO (101). Thus, each single column of the table corresponds to any one register in the register group (34). For example, the data in the column indicated by "#n" in FIG. 4 is the data stored in the "register n" in FIG. 3 (n is any value of 1 to N). Note that, as shown in FIG. 4, a register from which the scan test data is read once is used again as the functional characteristics of the FIFO (101). Specifically, a plurality of registers in the register group (34) of the FIFO (101) are used in a cyclic fashion. Therefore, after one cycle of writing and reading of the scan test data is done, the scan test data that is read from the same register appears again.

The scan test data is composed of input data and mask data. FIG. 4 shows an example in which the scan test data is 6 bits, the input data is 4 bits, and the mask data is 2 bits. In FIG. 4, the number of scan chains (2010) in the circuit to be tested (201) is larger than the number of bits (4 bits) of the input data.

The extension circuit (2011) extends the input data that is input from the FIFO (101) to a larger number of bits (the same number of bits as the number of scan chains (2010)) and outputs each bit of the extended input data to each of the scan chains (2010).

Note that, in the case of the semiconductor device (1A) shown in FIG. 1, the number of bits of the input data and the number of a plurality of scan chains (2010) are the same. Therefore, each bit of the input data that is input from the FIFO (101) is input to each of the plurality of scan chains (2010) as it is. The circuit to be tested (201) then operates, and thereby the test result data is stored in each of the scan chains (2010).

The compression circuit (2012) compresses the test result data output from the plurality of scan chains (2010) to data with a smaller number of bits, and outputs the compressed test result data to the test result compression device (202). In the example of FIG. 4, the data (data with a larger number of bits than 4 bits) that is output from the plurality of scan chains (2010) is compressed to 2 bits. Note that the number of bits of the data after compression by the compression circuit (2012) is the same as the number of bits of the mask data. The mask data output from the FIFO (101) is also input to the test result compression device (202) together with the compressed data.

As described above, FIG. 4 shows an example in which the size of each of the plurality of scan chains (2010) is N bits. In this example, after performing the scan shift operation N times and scanning the N-bit scan test data (input data) into each scan chain (2010), the circuit to be tested (201) performs the capture operation (normal operation) using the scan test data. The test result data is thereby stored into each scan chain (2010). After that, by performing the scan shift operation N times and scanning out the N-bit test result data in each scan chain (2010), the test result data is output to the test result compression device (202). Note that the next N-bit scan test data (input data) is scanned in during the scan-out.

Note that "pattern #1", . . . , "pattern #N" shown in FIG. 4 indicates a unit of scan test data on which a series of operations, which are scan-in, capture and scan-out, are performed (which is also referred to as "test pattern").

[Test Result Compression Device (202)]

The configuration of the test result compression device (202) according to the first embodiment is further described hereinafter with reference to FIG. 4. The block shown in the right part of FIG. 4 is a block showing the test result compression device (202). As shown in FIG. 4, the test result compression device (202) includes AND gates (2021, 2022) and a compression circuit (2023).

The test result compression device (202) is a device (circuit) that compresses the test result data that is output from the circuit to be tested (201). The test result data that is output from the circuit to be tested (201) and the mask data in the scan test data that is output from the FIFO (101) are input to the test result compression device (202). Specifically, this mask data is the mask data that constitute the scan test data together with the input data that is scanned in when this test result data is scanned out. Each of the AND gates (2021, 2022) carries out the logical AND (logical product operation) between each bit of the test result data and each bit of the mask data, and outputs result data to the compression circuit (2023). Thus, the masked test result data is output to the compression circuit (2023).

The compression circuit (2023) compresses a series of test result data sequentially input from the AND gates (2021, 2022). Data (compressed code) in a size smaller than the total size of all test result data is thereby obtained as a final test result. The configuration of the compression circuit (2023) is not particularly limited, and it may be a circuit including LFSR (Linear FeedBack Shift Register), for example.

[Test Control Device (200)]

Figure 5:
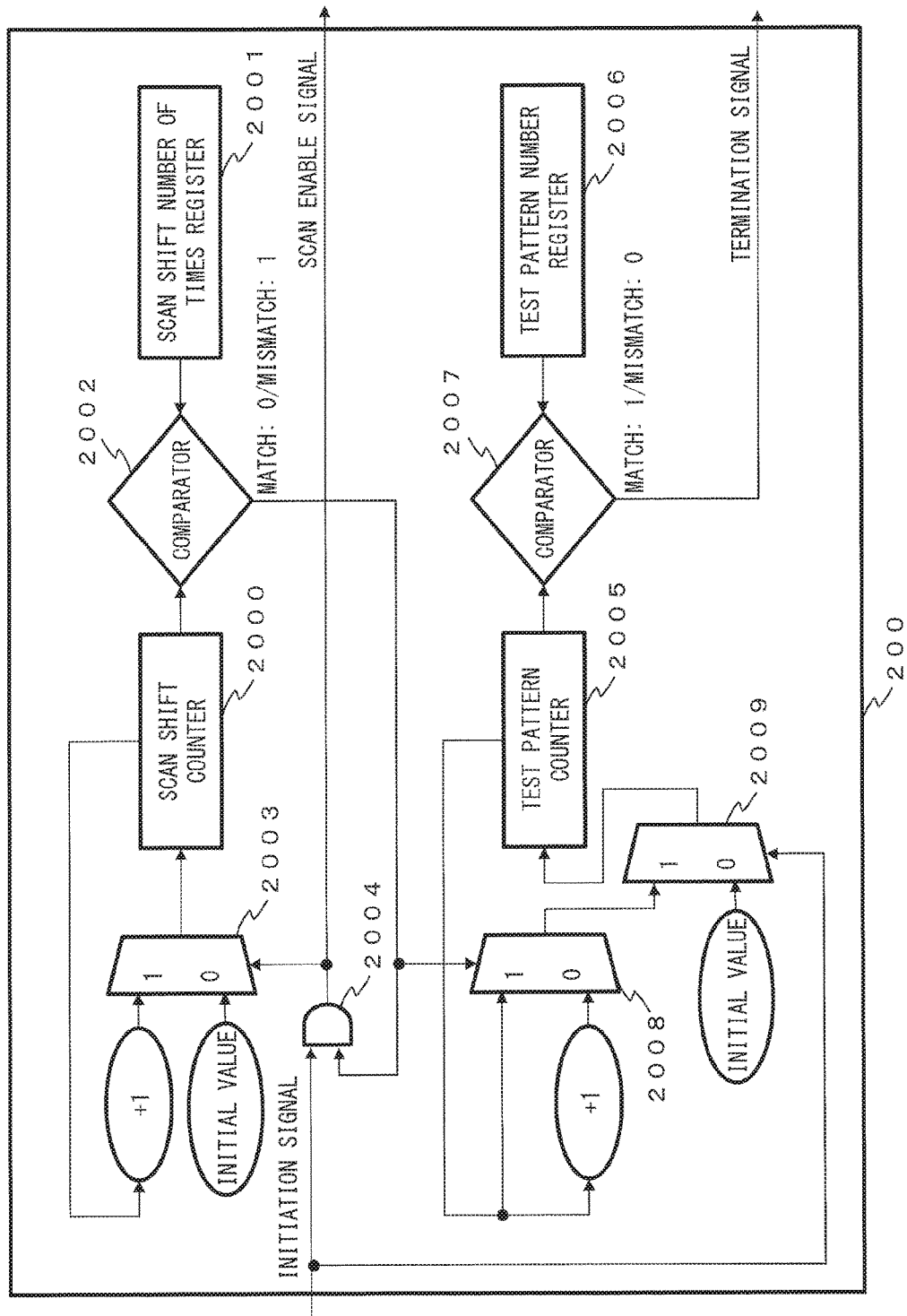
FIG. 5 is a schematic diagram of a test control device shown in FIG. 1.

The configuration of the test control device (200) according to the first embodiment is described hereinafter with reference to FIG. 5. FIG. 5 is a block diagram of the test control device (200) according to the first embodiment.

As shown in FIG. 5, the test control device (200) includes a scan shift counter (2000), a scan shift number of times register (2001), a comparator (2002), a selector (2003), an AND gate (2004), a test pattern counter (2005), a test pattern number register (2006), a comparator (2007), a selector (2008), and a selector (2009).

The scan shift counter (2000) is a counter that counts the number of times the scan shift operation is performed for the scan chains (2010) (the number of scanned-in scan test data) in synchronization with the second clock signal (210), and the count value is stored therein. The scan shift counter (2000) outputs the value stored therein to the comparator (2002) and the selector (2003).

The scan shift number of times register (2001) stores a value indicating the number of times the scan shift operation is performed in one test pattern (the number of scan test data in one test pattern). The value of the scan shift number of times register (2001) is set from the outside of the test control device (200) before performing a scan test, for example. Further, the value of the scan shift number of times register (2001) may be preset as a fixed value. The scan shift number of times register (2001) outputs the value stored therein to the comparator (2002).

The comparator (2002) compares the value that is output from the scan shift counter (2000) with the value that is output from the scan shift number of times register (2001), and outputs a value in accordance with a comparison result to the AND gate (2004) and the selector (2008). For example, the comparator (2002) outputs a negated signal when the compared values match, and outputs an asserted signal when the compared values do not match. The negated signal is a signal with a value of "0" (Low), and the asserted signal is a signal with a value of "1" (High). The same applies below.

Specifically, when the number of times the scan shift operation is performed from the start of scan-in of the scan test data in one test pattern is less than the number of times all the scan test data contained in that test pattern are input to the scan chains (2010) (the size of the scan chains (2010)), the comparator (2002) outputs the asserted signal (value "1"). On the other hand, when the number of times the scan shift operation is performed from the start of a scan test in one test pattern is the same as the number of times all the scan test data contained in that test pattern are input to the scan chains (2010), the comparator (2002) outputs the negated signal (value "0"). For example, in the example shown in FIG. 4, the comparator (2002) outputs "1" when the number of times the scan shift operation is performed from the start of scan-in of the scan test data in one test pattern is less than N, and outputs "0" when it is N.

The selector (2003) is a circuit that selects whether to increment or initialize the value of the scan shift counter (2000) in accordance with the value that is output from the AND gate (2004). To be more specific, the selector (2003) adds "1" to the value of the scan shift counter (2000) when the value that is output from the AND gate (2004) is "1", and initializes the value of the scan shift counter (2000) when the value that is output from the AND gate (2004) is "0". Specifically, when incrementing the value of the scan shift counter (2000), the selector (2003) outputs a value obtained by adding "1" to the value of the scan shift counter (2000) to the scan shift counter (2000) and stores it. On the other hand, when initializing the value of the scan shift counter (2000), the selector (2003) outputs an initial value "0" to the scan shift counter (2000) and stores it. Note that the increment or the initialization is carried out at the timing in synchronization with the second clock signal (210). In other words, the increment or the initialization is carried out at the timing when the edge of the second clock signal (210) is input to the test control device (200).

The AND gate (2004) carries out the logical AND (logical product operation) between the value of an input initiation signal and the value that is output from the comparator (2002), and outputs a result value to the selector (2003) and the outside. The value that is output to the outside is input as a scan enable signal to the FIFO (101), the circuit to be tested (201) and the test result compression device (202). The scan enable signal that is input to the FIFO (101) serves as the read signal as described above.

The initiation signal is a signal which is asserted when the empty signal that is input from the FIFO (101) to the test control device (200) is negated. For example, the test control device (200) includes a circuit that outputs the initiation signal to the AND gate (2004) in accordance with the empty signal that is input from the FIFO (101). This circuit asserts and outputs the initiation signal when the empty signal is negated. Note that the initiation signal is negated after all the scan test data are output from the FIFO (101) as described later.

Thus, stated differently, the AND gate (2004) outputs the output value from the comparator (2002) when the value of the initiation signal is "1". Then, when a comparison result in the comparator (2002) is a mismatch and the output value from the comparator (2002) that is input to the selector (2003) is "1", the selector (2003) selects the increment. On the other hand, when a comparison result in the comparator (2002) is a match and the output value from the comparator (2002) that is input to the selector (2003) is "0", the selector (2003) selects the initialization.

In this operation, when the FIFO (101) is not empty and the scan test data is scan in the scan chains (2010), the number of times the scan shift operation is performed is counted. Then, when the number of times the scan shift operation is performed in one test pattern reaches the number of times all the scan test data contained in that test pattern are input to the scan chains (2010), the value of the scan shift counter (2000) is initialized. In other words, each time all the scan test data in one test pattern are input to the scan chains (2010), the value of the scan shift counter (2000) is initialized in the test control device (200). Thus, the scan shift counter (2000) can repeat the counting of the number of scan test data input to the scan chains (2010) for each test pattern.

Further, in this operation, each time all the scan test data in one test pattern are input to the scan chains (2010), the test control device (200) negates the scan enable signal once. When the asserted scan enable signal is input from the test control device (200), the circuit to be tested (201) performs the scan shift operation. On the other hand, the negated scan enable signal is input from the test control device (200), the circuit to be tested (201) performs the capture operation (normal operation). Thus, each time all the scan test data in one test pattern are input to the scan chains (2010), one-block capture operation can be carried out. In other words, a single-clock scan test is conducted.

Further, when the asserted scan enable signal is input from the test control device (200), the test result compression device (202) performs the compression of the test result data. On the other hand, when the negated scan enable signal is input from the test control device (200), the test result compression device (202) does not perform the compression of the test result data. Therefore, only when the circuit to be tested (201) performs the scan shift operation and outputs the next test result data, the test result compression device (202) can generate a compressed code based on the test result data. It is thereby possible to prevent taking in the data output from the circuit to be tested (201) during the capture operation and generate correct test results.

The test pattern counter (2005) is a counter that counts the number of test patterns scanned into the scan chains (2010) in synchronization with the second clock signal (210). Specifically, the test pattern counter (2005) stores a value indicating the number of test patterns scanned into the scan chains (2010). The test pattern counter (2005) outputs the value stored therein to the comparator (2007) and the selector (2008).

The test pattern number register (2006) stores the value indicating the number of test patterns input to the FIFO (101) by the test pattern generation device (100). The value of the test pattern number register (2006) is set from the outside of the test control device (200) before performing a scan test, for example. Further, the value of the test pattern number register (2006) may be preset as a fixed value. The test pattern number register (2006) outputs the value stored therein to the comparator (2007).

The comparator (2007) compares the value that is output from the test pattern counter (2005) with the value that is output from the test pattern number register (2006), and outputs a value in accordance with a comparison result as a termination signal to the test result compression device (202). For example, the comparator (2007) outputs the asserted signal (value "1") when the compared values match, and outputs the negated signal (value "0") when the compared values do not match.

The selector (2008) is a circuit that selects whether or not to increment the value of the test pattern counter (2005) in accordance with the value that is output from the comparator (2002). To be more specific, the selector (2008) adds "1" to the value of the test pattern counter (2005) when the value that is output from the comparator (2002) is "0", and does not add "1" to the value of the test pattern counter (2005) when the value that is output from the comparator (2002) is "1". Specifically, when incrementing the value of the test pattern counter (2005), the selector (2008) outputs a value obtained by adding "1" to the value of the test pattern counter (2005) to the selector (2009). On the other hand, when not incrementing the value of the test pattern counter (2005), the selector (2008) outputs the value of the test pattern counter (2005) to the selector (2009) without any change.

The selector (2009) is a circuit that selects whether to increment or maintain the value of the test pattern counter (2005) in accordance with the value of the initiation signal that is output inside the test control device (200). To be more specific, the selector (2009) increments or maintain the value of the test pattern counter (2005) when the value of the initiation signal is "1", and initializes the value of the test pattern counter (2005) when the value of the initiation signal is "0". Specifically, when incrementing or maintaining the value of the test pattern counter (2005), the selector (2009) outputs the value that is output from the selector (2008) to the test pattern counter (2005) and stores it. On the other hand, when initializing the value of the test pattern counter (2005), the selector (2009) outputs an initial value "0" to the test pattern counter (2005) and stores it.

Note that the increment, the maintaining the same value, or the initialization is carried out at the timing that is synchronous with the second clock signal (210). In other words, the increment, the maintaining the same value, or the initialization is carried out at the timing when the edge of the second clock signal (210) is input to the test control device (200).

In this operation, the number of times the scan shift operation is performed is counted when the FIFO (101) is not empty and the scan test data is scanned in the scan chains (2010). Then, when the number of times the scan shift operation is performed from the start of a scan test in one test pattern reaches the number of times all the scan test data contained in that test pattern are input to the scan chains (2010), "1" is added to the value of the test pattern counter (2005). In other words, each time all the scan test data in one test pattern are input to the scan chains (2010), "1" is added to the value of the test pattern counter (2005). Then when all the test patterns (all the scan test data) are output from the FIFO (101), the value of the test pattern counter (2005) is initialized. Therefore, the test pattern counter (2005) can count the number of test patterns input to the scan chains (2010).

Further, in this operation, when the number of test patterns input to the scan chains (2010) from the start of a scan test reaches the number where all the test patterns are input to the scan chains (2010), the test control device (200) outputs the asserted termination signal to the test result compression device (202). In other words, when all the test patterns (all the scan test data) are output from the FIFO (101), it can be notified, by the termination signal, to the test result compression device (202).

[Operation Flow]

Figure 6:
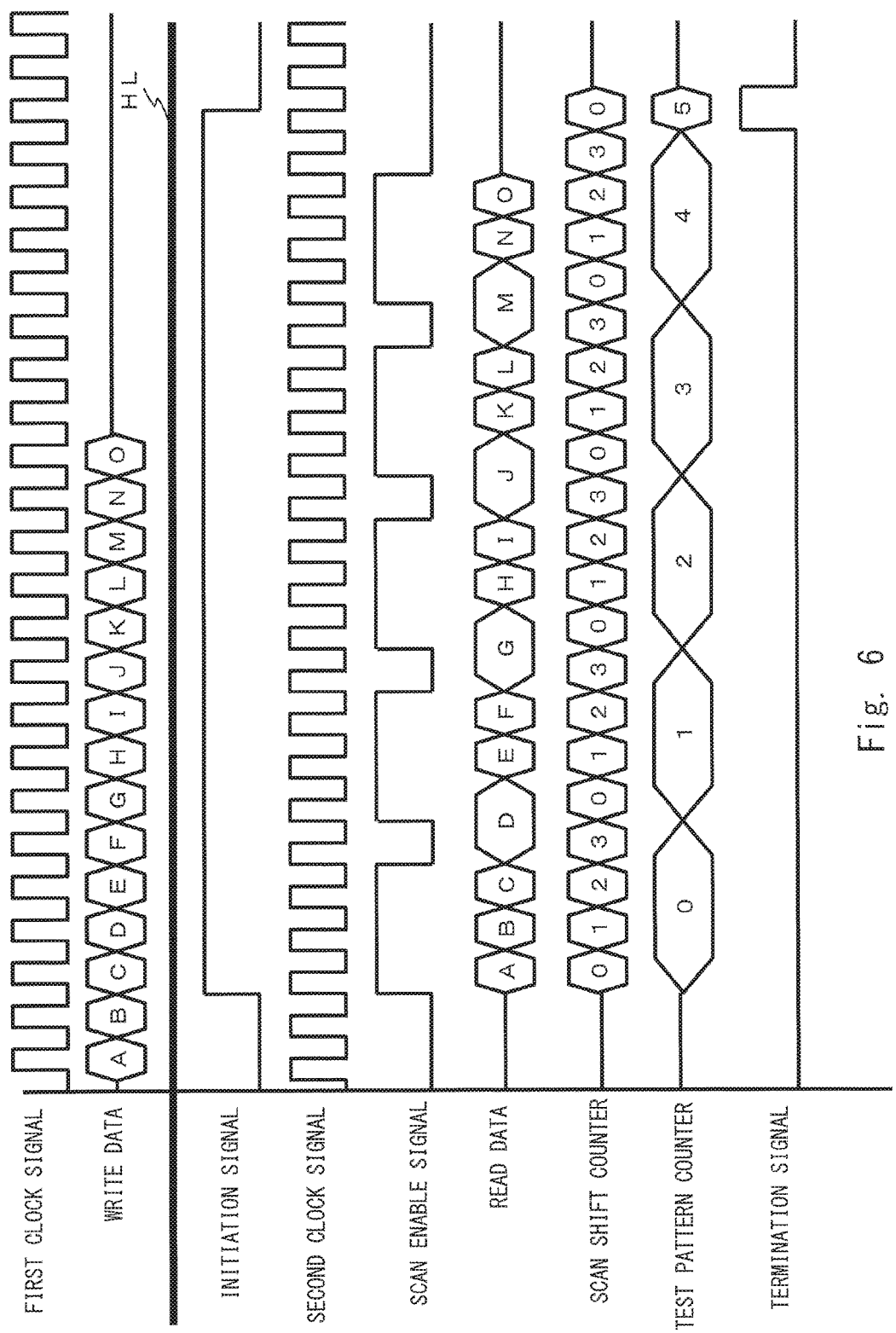
FIG. 6 is a diagram showing the operation waveform of the semiconductor device according to the first embodiment.

The operation of the semiconductor device (1B) according to the first embodiment is described hereinafter with reference to FIG. 6. FIG. 6 is a diagram showing the operation waveform of the semiconductor device (1B) according to the first embodiment.

In FIG. 6, the upper part (the waveform above the line HL) shows the waveform of a circuit in the first power supply region (10) shown in FIG. 1, and the lower part (the waveform below the line HL) shows the waveform of a circuit in the second power supply region (20) shown in FIG. 1. In those waveforms, the first clock signal and the second clock signal have the same frequency, but their edges are not aligned. Accordingly, the first clock signal and the second clock signal are not synchronous. Hereinafter, the operation is described with reference also to FIGS. 3 to 5, using the semiconductor device (1B) shown in FIG. 2 as an example.

Arbitrary values are prestored in the scan shift number of times register (2001) and the test pattern number register (2006) in accordance with the content of the scan test data supplied to the circuit to be tested (201). To store those values, the scan shift number of times register (2001) and the test pattern number register (2006) may have a configuration including a shift register for data setting, and the values may be stored by sequentially inputting them from the outside. Note that this operation is performed only before the initiation of a test, and it does not cause the overhead of a test time even if it is carried out at low rate.

Note that FIG. 6 shows an example in which the number of test patterns is "5", and the number of scan test data in one test pattern is "3". Thus, in this example, the value stored in the scan shift number of times register (2001) is "3", and the value stored in the test pattern number register (2006) is "5".

When an instruction for initiation of a scan test is given from the outside, the test pattern generation device (100) starts writing of the scan test data to the FIFO (101) in synchronization with the first clock signal (110). As shown in FIG. 6, the test pattern generation device (100) sequentially stores the scan test data "A" to "O" into the FIFO (101).

The writing of the scan test data to the FIFO (101) is performed continuously until all the scan test data are written to the FIFO (101) if the test pattern generation device (100) is in the state capable of supplying the scan test data to the FIFO (101), as long as the FIFO (101) does not overflow (as long as the full signal is not asserted).

Note that the input of the scan test data may be initiated by inputting a signal instructing the initiation from the outside of the semiconductor device (1B) to the test pattern generation device (100), or may be initiated by generating a signal instructing the initiation inside the semiconductor device (1B) and inputting the signal to the test pattern generation device (100).

When the scan test data starts to be written to the FIFO (101), the empty determination circuit (41) of the FIFO (101) negates the empty signal which has indicated that the FIFO (101) is empty, and changes it to indicate that the FIFO (101) is not empty. When the empty signal is negated, the initiation signal of the test control device (200) is asserted. The scan enable signal is thereby asserted, and the scan test operation of the semiconductor device (1B) is initiated.

The scan test data is read from the FIFO (101) in synchronization with the second clock signal (210), and a part of the data is input as input data to the extension circuit (2011), and the other part of the data is input as mask data to the test result compression device (202). The logical product operation (logical AND operation) of the mask data that is input to the test result compression device (202) and the output value of the compression circuit (2012) is carried out by the AND gates (2021, 2022). Some of the test result data that is output from the scan chains (2010) through the compression circuit (2012) is an indeterminate value (which is a value not determined as "0" (Low) or "1" (High)), and this operation is to forcibly fix such an indeterminate value to "0" (Low).

The test result data after the logical product operation that is output from the AND gates (2021, 2022) is input to the compression circuit (2023). During the period when the scan enable signal that is input from the test control device (200) is asserted (when the scan shift operation is carried out), the compression circuit (2023) continuously converts the input test result data into the compressed code, taking over the currently held value.

On the other hand, each time the scan shift operation is performed in synchronization with the second clock signal (210), "1" is added to the value of the scan shift counter (2000). Then, when the value of the scan shift counter (2000) becomes the same as the value of the scan shift number of times register (2001), it means that all of the scan test data in one test pattern are input to the circuit to be tested (201). At this time, the scan enable signal is negated.

For example, in FIG. 6, this corresponds to the state where the three scan test data "A" to "C" are read out as the read data and input to the scan chains (2010), and the next read data is the scan test data "D".

When the scan enable signal that is input from the test control device (200) is negated, the circuit to be tested (201) performs the capture operation in a scan test. At this time, the circuit to be tested (201) suspends the reading of the scan test data from the FIFO (101). Thus, as shown in FIG. 6, the state where the read data is the scan test data "D" is maintained.

Then, the value of the scan shift counter (2000) is updated to the initial value. Specifically, as shown in FIG. 6, because the value of the scan shift counter (2000) is "3", which is the same as the value "3" of the scan shift number of times register (2001), the value of the scan shift counter (2000) is initialized to "0". Further, at this time, the value of the test pattern counter (2005) is incremented. Specifically, as shown in FIG. 6, since all the scan test data "A" to "C" in the first test pattern are input to the scan chains (2010), the value of the test pattern counter (2005) is updated from "0" to "1".

By the initialization of the scan shift counter (2000), the scan enable signal is asserted again. Specifically, because the value of the scan shift counter (2000) is initialized to "0", which is not the same as the value "3" of the scan shift number of times register (2001), the scan enable signal is asserted in accordance with the output value of the comparator (2002) in this case as shown in FIG. 6. The reading of the scan test data from the FIFO (101) and the scan shift operation by the circuit to be tested (201) and the compression operation by the test result compression device (202) are thereby resumed. Specifically, as shown in FIG. 6, the scan test data "D" is read out and input to the scan chains (2010). Note that, from this point forward, at the same time as when the scan test data "D" to "F" are input to the scan chains (2010), the test result data by the scan test data "A" to "C" are output from the scan chains (2010) to the test result compression device (202).

This series of operations are repeated until the value of the test pattern counter (2005) becomes the same as the value set to the test pattern number register (2006) and the termination signal is asserted. Specifically, as shown in FIG. 6, since the fifth test pattern (the scan test data "M" to "O"), which is the last one, is input, and the value "5" of the test pattern counter (2005) is the same as the value "5" of the test pattern number register (2006), the comparator (2007) asserts the termination signal to be output to the test result compression device (202).

To allow updating the test pattern counter (2005) and outputting the termination signal after the input of all the scan test data as well, the timing when the initiation signal is negated is slightly later than the timing when the empty signal is negated as shown in FIG. 6. For example, the above-described circuit that outputs the initiation signal negates the initiation signal when the termination signal is output from the comparator (2007). Further, as shown in FIG. 6, even after the value of the scan shift counter (2000) is initialized, the scan enable signal remains negated while the termination signal is output in order to prevent the invalid scan shift operation.

When the termination signal is asserted, the test result compression device (202) takes out the compressed code that is stored in the compression circuit (2023) and checks it against an expected value that is prepared in advance, and thereby determines a test result. When, as a result of checking the final code against the expected value, the final code and the expected value match, the test result compression device (202) determines that the circuit to be tested (201) is normal, and when the final code and the expected value do not match, the test result compression device (202) determines that the circuit to be tested (201) is abnormal. Note that this comparison between the test result and the expected value is performed only after the termination of a test, and it does not cause the overhead of a test time even if it is carried out at low rate.

It should noted that, although the scan test data "M" to "O" in the last (fifth) test pattern are input to the scan chains (2010) in FIG. 6, because the scan enable signal remains negated after that, the test result data is not used for generation of the compressed code in the test result compression device (202). Thus, in the last (fifth) test pattern, the scan test data "M" to "O" in the previous (fourth) test pattern serve as dummy scan test data for reading the test result data. Therefore, to be exact, the state of the circuit to be tested (201) is determined by the test result data for the first to fourth test patterns.

Further, in the scan test data "A" to "C" in the first test pattern, no test pattern exists before that. Therefore, as shown in FIG. 4, all the mask data of the scan test data "A" to "C" in the first test pattern are set to "0". Thus, when inputting the scan test data in the first test pattern into the scan chains (2010), data that is output from the scan chains (2010) is fixed to "0" so that the data does not affect the generation of the compressed code in the test result compression device (202).

The operation of the scan test described above is performed in parallel with and independently of the writing of the scan test data from the test pattern generation device (100) to the FIFO (101) which is described earlier. Therefore, in the first embodiment, the reading rate of the scan test data from the FIFO (101) is preferably not higher than the writing rate of the scan test data to the FIFO (101).

As described above, there is a case where a circuit to be tested and a device that supplies the scan test data are connected to voltage lines that supply different power supply voltages, and one voltage varies relatively with the other voltage. In such a situation, there are two cases: the case where a hold time becomes severe and the case where a setup time becomes severe, in the scan test data transmission path.

On the other hand, as described above, the first embodiment uses the asynchronous FIFO, rather than allowing for a large hold-time margin by adding a delay, as a measure against the timing violations in the case where the scan test data transmission path runs across the logical boundary with different power supplies.

Specifically, in the semiconductor device (1A, 1B) according to the first embodiment, the test pattern generation device (100) sequentially writes a plurality of test data (input data of scan test data) to the FIFO (101) in synchronization with the first clock signal (110). Then, in parallel with the writing of the plurality of test data to the FIFO (101), the test control device (200) sequentially reads a plurality of test data stored in the FIFO (101) in synchronization with the second clock signal (210), which is not synchronous with the first clock signal (110), and performs a scan test of the circuit to be tested (201).

By use of the asynchronous FIFO, even when a circuit that supplies scan test data and a circuit that performs a scan test by using the scan test data are located in different regions where the circuits are driven by different voltages, it is possible to drive the circuits in the respective regions at the most appropriate rate without rate limiting by the propagation delay of the scan test data in the transmission path.

The test data can be thereby accumulated in the FIFO (101), and it is possible to perform a scan test of the circuit to be tested (201) in synchronization with the second clock signal (210) without being affected by the first clock signal (110). Accordingly, the timing violations do not occur. Further, this eliminates the need to perform a scan test after loading all the scan test data. Since loading of the scan test data and a scan test can be simultaneously carried out in parallel, it is possible to reduce the time needed for a scant test. By reducing the time needed for a scant test, it becomes possible to satisfy requirements (e.g., completion of a runtime test in 10 msec) related to a runtime test execution time (FTTI: fault tolerant time interval), for example.

Note that, in order to clarify the improvement of a scan test execution time in the case where the scan test data transmission path runs across regions where clock signals are asynchronous with each other, the configuration in which the scan test data transmission path runs across asynchronous regions such as the first power supply region and the second power supply region (the first clock signal and the second clock signal) is described for the sake of explanation as an example in the first embodiment; however, it may be used also for the transfer of scan test data between circuits located in the same power supply region and the transmission of scan test data between circuits driven by the same clock signal.

The circuit diagram shown in the first embodiment schematically shows each composing element in order to describe the first embodiment and, in the actual design of a circuit, an additional circuit such as a circuit (e.g., flip-flop) that adjusts a clock cycle to supply the scan test data is required in accordance with the specifications of a clock and a scan test to be applied as a matter of course. The same applies to the following embodiments.

Second Embodiment

A second embodiment is described hereinbelow. In the following description of the second embodiment, the same elements as in the first embodiment described above are denoted by the same reference symbols or the like, and the description of the same is omitted as appropriate.

[Overall Configuration]

Figure 7:
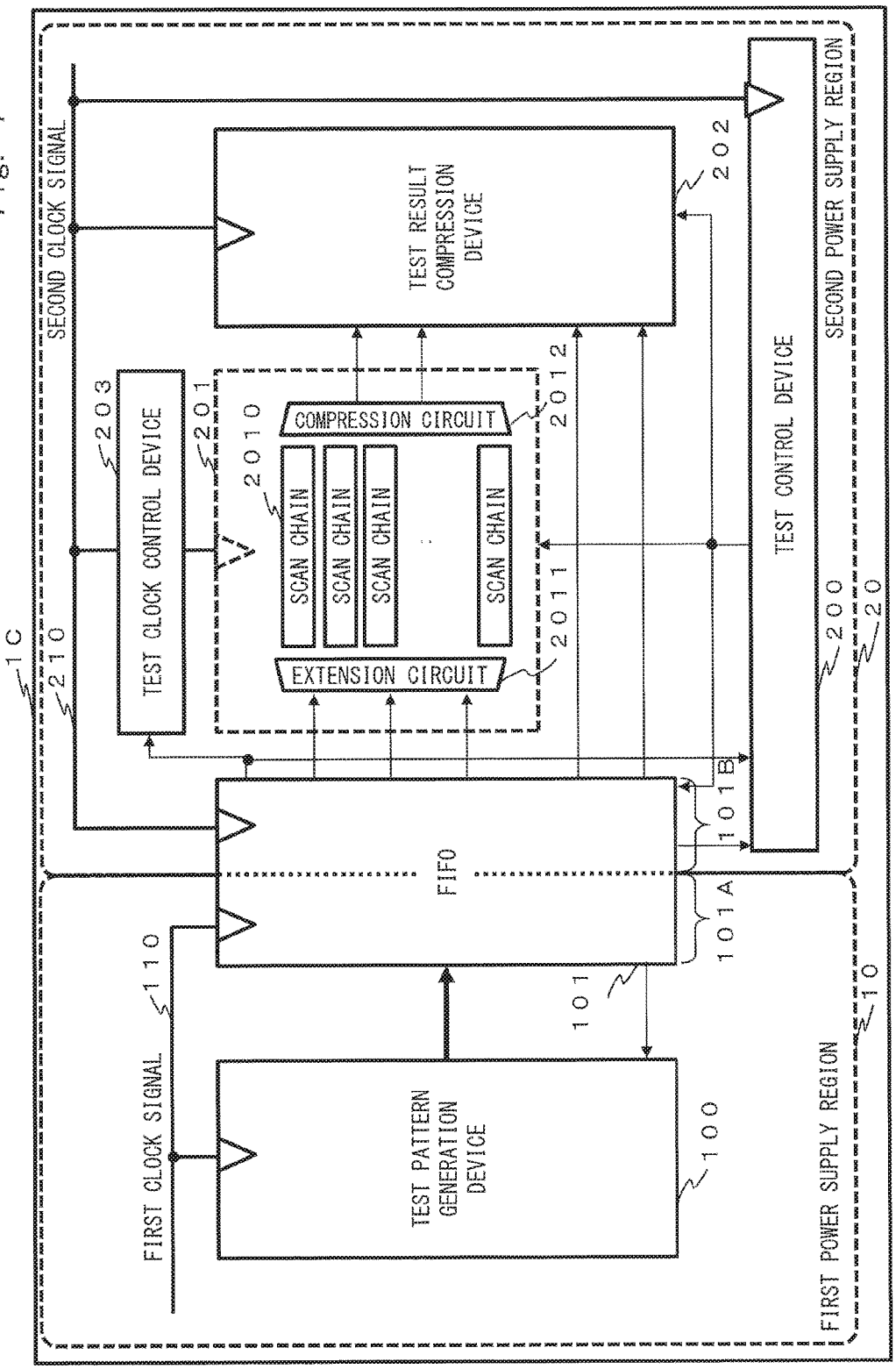
FIG. 7 is a schematic diagram of a semiconductor device according to a second embodiment.

The configuration of a semiconductor device (1C) according to the second embodiment is described hereinafter with reference to FIG. 7. FIG. 7 is a schematic diagram of the semiconductor device (1C) according to the second embodiment.

As shown in FIG. 7, the semiconductor device (1C) according to the second embodiment is different from the semiconductor device (1B) according to the first embodiment in that it further includes a test clock control device (203).

The test clock control device (203) is included in the second power supply region (20). The second clock signal (210) is input to the test clock control device (203). Thus, the test clock control device (203) is driven by the second clock signal (210). Further, the test clock control device (203) generates a scan test clock based on the second clock signal (210), and outputs the scan test clock to the circuit to be tested (201). Thus, the circuit to be tested (201) according to the second embodiment is driven by the scan test clock, instead of the second clock signal (210), compared with the first embodiment. Further, in the second embodiment, the FIFO (101) outputs the empty signal also to the test clock control device (203).

[Test Clock Control Device (203)]

Figure 8:
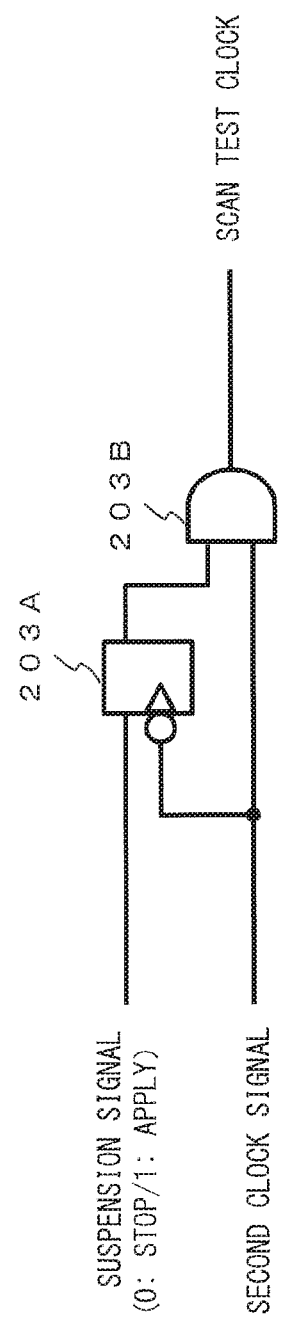
FIG. 8 is a schematic diagram of a test clock control device shown in FIG. 7.

The configuration of the test clock control device (203) according to the second embodiment is described hereinafter with reference to FIG. 8. FIG. 8 is a block diagram of the test clock control device (203) according to the second embodiment.

As shown in FIG. 8, the test clock control device (203) includes a flip-flop (203A) and an AND gate (203B).

A suspension signal and the second clock signal (210) are input to the flip-flop (203A). The flip-flop (203A) stores the value of the suspension signal into itself at the falling edge of the second clock signal (210). The flip-flop (203A) outputs the value of the suspension signal stored therein to the AND gate (203B).

The suspension signal is a signal that is negated when the empty signal that is input from the FIFO (101) to the test clock control device (203) is asserted. On the other hand, the suspension signal is asserted when the empty signal that is input from the FIFO (101) to the test clock control device (203) is negated. For example, the test clock control device (203) includes a circuit that outputs the suspension signal the AND gate (203B) in accordance with the empty signal that is input from the FIFO (101). This circuit negates the suspension signal when the empty signal is asserted, and asserts the suspension signal when the empty signal is negated.

The value that is output from the flip-flop (203A) and the second clock signal (210) are input to the AND gate (203B). the AND gate (203B). carries out the logical AND (logical product operation) between the value from the flip-flop (203A) and the value of the second clock signal (210), and outputs a result value as the scan test clock to the circuit to be tested (201). Thus, the AND gate (203B) performs anyone of an operation to output the second clock signal (210) and an operation to stop the output in accordance with the value from the flip-flop (203A).

Figure 9:
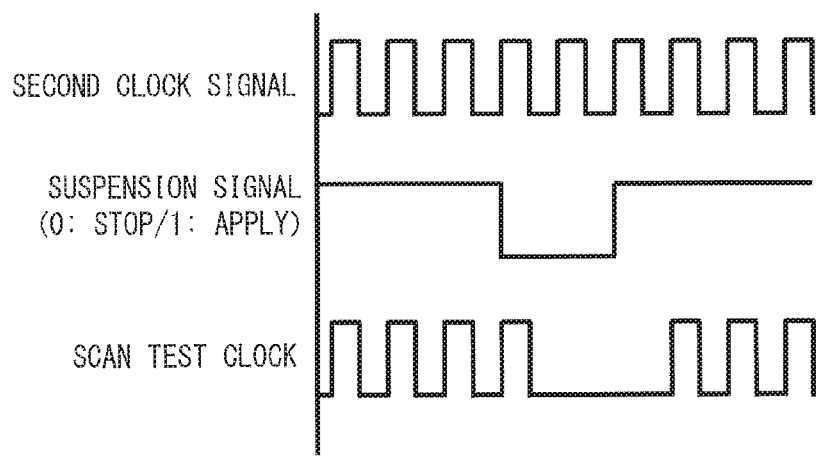
FIG. 9 is a diagram showing the operation waveform of the test clock control device shown in FIG. 8.

The scan test clock is thereby output as shown in FIG. 9. FIG. 9 is a diagram showing the operation waveform in the test clock control device (203) shown in FIG. 8. As shown therein, when the suspension signal is "1" (High), the second clock signal (210) is output as the scan test clock without any change. On the other hand, when the suspension signal is "0" (Low), a signal that remains "0" (Low) is output as the scan test clock. In other words, when the FIFO (101) is not empty, the second clock signal (210) is output to the circuit to be tested (201) without any change, and when the FIFO (101) is empty, the output of the second clock signal (210) to the circuit to be tested (201) is inhibited.

[Operation Flow]

Figure 10:
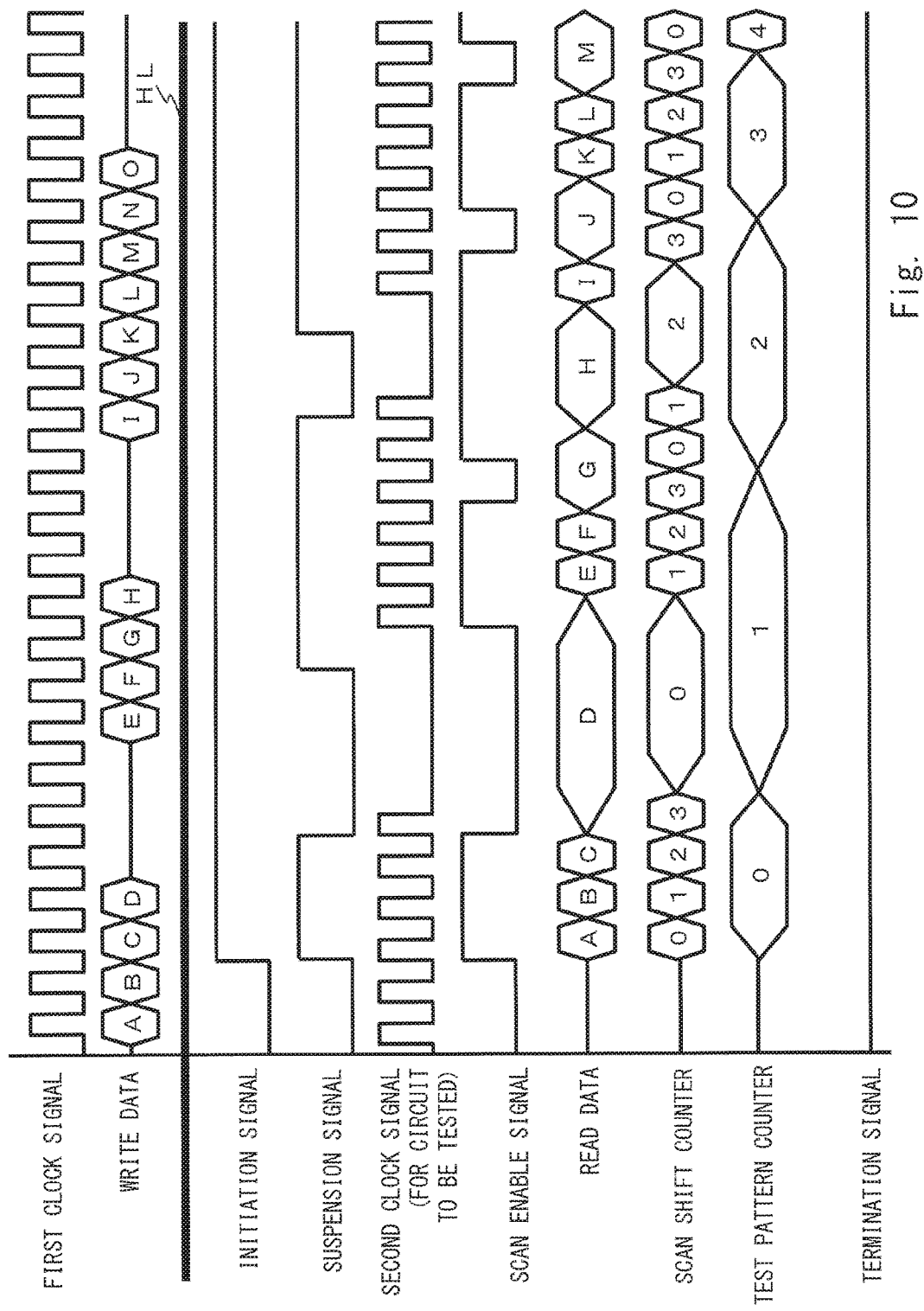
FIG. 10 is a diagram showing the operation waveform of the semiconductor device according to the second embodiment.

The operation of the semiconductor device (1C) according to the second embodiment is described hereinafter with reference to FIG. 10. FIG. 10 is a diagram showing the operation waveform of the semiconductor device (1C) according to the second embodiment.

In FIG. 10, the upper part (the waveform above the line HL) shows the waveform of a circuit in the first power supply region (10) shown in FIG. 7, and the lower part (the waveform below the line HL) shows the waveform of a circuit in the second power supply region (20) shown in FIG. 7. In those waveforms, the first clock signal and the second clock signal have the same frequency, but their edges are not aligned. Thus, the first clock signal and the second clock signal are not synchronous. Hereinafter, the operation is described with reference also to FIGS. 3 to 5, using the semiconductor device (1C) shown in FIG. 7 as an example.

In response to an instruction for the initiation of a scan test, writing of the scan test data to the FIFO (101) is started. Note that the operation until the start of the scan test operation is the same as in the first embodiment, and the description of the operation is omitted.

Just like in the first embodiment, the scan test data is taken out of the FIFO (101) in synchronization with the second clock signal (210), and a part of the data is input as the input data to the extension circuit (2011), and the other part of the data is input as the mask data to the test result compression device (202). The test result compression device (202) carries out the logical product operation of the mask data and the output value of the compression circuit (2012) by the AND gates (2021, 2022), and converts the result into the compressed code, taking over the previous value by the compression circuit (2023).

This embodiment is different from the first embodiment in the operation at the occurrence of a situation where the scan test data cannot be taken out of the FIFO (101) (i.e., the FIFO (101) is empty) during execution of a scan time. Note that, by the operation described hereinbelow, the second embodiment solves the problem that the data to be scanned into the scan chains (2010) becomes not normal to cause a failure in scan test due to the occurrence of a situation where the FIFO (101) becomes empty and the scan test data cannot be taken out.

In the second embodiment, to avoid such a situation, the test clock control device (203) is included in the semiconductor device (1C). The test clock control device (203) monitors the empty signal of the FIFO (101), and when the FIFO (101) becomes empty, it negates the suspension signal and thereby stops the scan test clock. Specifically, the scan test clock is stopped as shown in FIG. 10.

FIG. 10 illustrates the case where it becomes impossible to write the scan data to the FIFO (101) temporarily due to some reasons at the point of time when the scan test data "A" to "D" are written to the FIFO (101). In this case, when the scan test data "C" is read from the FIFO (101), the registers indicated by the gray code counter (32) and the gray code counter (42) match, and therefore the empty signal is asserted. Thus, this register is a register to store the scan test data "D". Accordingly, the scan test data "D" is read to the register (44), and the register group (34) becomes empty.

The suspension signal is thereby negated, and the test clock control device (203) inhibits the output of the second clock signal (210) to the circuit to be tested (201). Specifically, the scan test clock that remains "0" (Low) is output to the circuit to be tested (201).

During the period when the empty signal from the FIFO (101) is asserted, the test control device (200) negates the scan enable signal that is output as the read signal to the FIFO (101). The FIFO (101) thereby suspends the update of the gray code in the gray code counter (42). Specifically, as shown in FIG. 10, the scan test data "D" is maintained as the read data that is output from the FIFO (101).

Further, during the period when the empty signal from the FIFO (101) is asserted, the test control device (200) negates the scan enable signal that is output to the test result compression device (202). The compression operation of the test result data is thereby suspended, and the compression operation in the case where new test result data is not output from the circuit to be tested (201) is thereby avoided.

Note that the suspension of update of the gray code and the suspension of the compression of the test result data may be performed by causing the output circuit (40) and the test result compression device (202) to operate in synchronization with the scan test clock from the test clock control device (203), just like the circuit to be tested (201), instead of negating the scan enable signal as described above. Note that, however, in order to enable cancellation of the empty state (to enable negation of the empty signal), the second clock signal (210) is supplied to the empty determination circuit (41) so as not to stop its operation.

Further, during the period when the empty signal that is input from the FIFO (101) is negated, the test control device (200) suspends the counting of the scan shift counter (2000). Specifically, as shown in FIG. 10, "0" is maintained as the value of the scan shift counter (2000).

Because the circuit to be tested (201) is driven by the scan test clock, the scan shift operation is suspended when the scan test clock is maintained at "0" (Low). Accordingly, the scan shift operation that inputs abnormal data to the scan chains (2010) does not occur.

When the writing of the scan test data to the FIFO (101) is resumed, the FIFO (101) becomes not empty and the empty signal is negated. When the empty signal is negated, the test clock control device (203) negates the suspension signal. The clock control device (203) thereby resumes the output of the second clock signal (210) to the circuit to be tested (201) as the scan test clock. Specifically, as shown in FIG. 10, the circuit to be tested (201) starts the reading of the scan test data, beginning with the scan test data "D".

Further, at this time, the test control device (200) asserts the scan enable signal that is output as the read signal to the FIFO (101) in response to negation of the empty signal from the FIFO (101). The FIFO (101) thereby resumes the update of the gray code in the gray code counter (42).

As a result, the scan test data is taken out of the register where the suspension has occurred, and the scan shift operation is resumed. Specifically, as shown in FIG. 10, the read data that is output from the FIFO (101) is sequentially updated to the scan test data after the scan test data "E" in synchronization with reading of the scan test data from the circuit to be tested (201).

Although the configuration of the test control device (200) according to the second embodiment is substantially the same as the configuration in the first embodiment, it is different from the one in the first embodiment in that a mechanism to hold the previous value is added to the scan shift counter (2000). The test control device (200) according to the second embodiment further includes a circuit (not shown) that outputs a control signal based on the empty signal to the scan shift counter (2000) in order to suspend the update of the value of the scan shift counter (2000).

This control signal functions in the same manner as the suspension signal in the test clock control device (203). This circuit suspends the update of the counter value of the scan shift counter (2000) when the FIFO (101) is empty. To be more specific, this circuit asserts the control signal to be output to the scan shift counter (2000) when the empty signal that is input from the FIFO (101) to the test control device (200) is asserted. When the asserted control signal is input, the scan shift counter (2000) inhibits the update of its value regardless of the output value from the selector (2003). On the other hand, this circuit negates the control signal to be output to the scan shift counter (2000) when the empty signal that is input from the FIFO (101) to the test control device (200) is negated. When the negated control signal is input, the scan shift counter (2000) updates its value.

The other operations of the test clock control device (203) are the same as those in the first embodiment, and the description of those operations is omitted. Further, the operation after the termination signal is asserted is also the same as that in the first embodiment, and the description of that operation is also omitted.

As described above, in the second embodiment, the test clock control device (203) is added to the configuration in the first embodiment, and it is thereby possible to eliminate the problem when the FIFO (101) is empty, which occurs in the first embodiment.

Specifically, in the second embodiment, when the empty determination circuit (41) determines that the FIFO (101) is empty, the reading of the test data from the FIFO (101) is stopped. To be more specific, when the empty determination circuit (41) determines that the FIFO (101) is empty, the test clock control device (203) stops the supply of the second clock signal to the circuit to be tested (201). It is thereby possible to prevent that invalid test data is scanned into the circuit to be tested (201) from the empty FIFO (101).

In the first embodiment, it is necessary to use the FIFO (101) with a relatively large capacity or occupy resources to acquire the scan test data to be written to the FIFO (101) in order that the FIFO (101) does not become empty. However, in the second embodiment, such restrictions are not placed, and it is thereby possible to use the FIFO (101) with a relatively small capacity and permit the interrupt due to sharing of resources to acquire the data. As a result, it is possible to reduce the circuit overhead for constructing the system.

Note that, although an example in which the test clock control device (203) is applied to the semiconductor device (1B) shown in FIG. 2 is described above, the present invention is not limited thereto. As a matter of course, the test clock control device (203) may be applied to the semiconductor device (1A) shown in FIG. 1.

Third Embodiment

Figure 11:
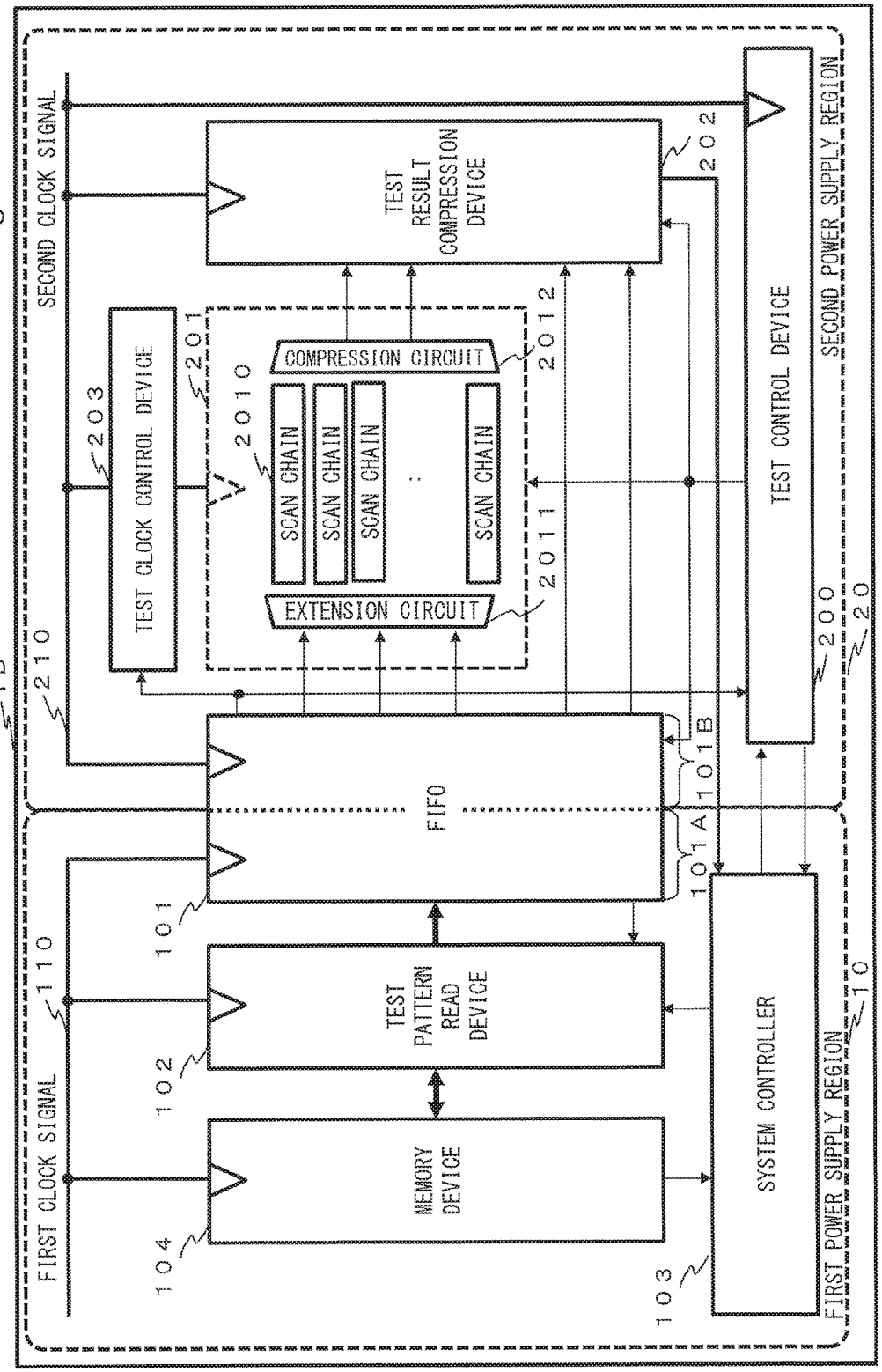
FIG. 11 is a schematic diagram of a semiconductor device according to a third embodiment.

A third embodiment is described hereinbelow. In the following description of the third embodiment, the same elements as in the second embodiment described above are denoted by the same reference symbols or the like, and the description of the same is omitted as appropriate.
[Overall Configuration]
The configuration of a semiconductor device (1D) according to the third embodiment is described hereinafter with reference to FIG. 11. FIG. 11 is a schematic diagram of the semiconductor device (1D) according to the third embodiment. The semiconductor device (1D) according to the third embodiment is an embodiment that is suitable for execution of a runtime test with use of a scan test mechanism.

As shown in FIG. 11, the semiconductor device (1D) according to the third embodiment is different from the semiconductor device (1C) according to the second embodiment in that it includes a test pattern read device (102) instead of the test pattern generation device (100), and further includes a system controller (103) and a memory device (104).

The test pattern read device (102), the system controller (103) and the memory device (104) are included in the first power supply region (10). The test pattern read device (102) is electrically connected to the memory device (104). The test pattern read device (102), the system controller (103) and the memory device (104) are electrically connected through the system bus.

The test pattern read device (102) sequentially reads a plurality of scan test patterns that are stored in the memory device (104) and writes them into the FIFO (101).

The system controller (103) is a circuit that exercises control over the semiconductor device (1D). The system controller (103) performs control of initiation of a scan test in the semiconductor device (1D) and determination on a scan test result. Specifically, in the third embodiment, differently from the first and second embodiments, the system controller (103), instead of the test result compression device (202), determines a scan test result.

The memory device (104) is a storage device (storage circuit) that stores a plurality of scan test data. The memory device (104) stores all the scan test data. The memory device (104) is a nonvolatile storage device such as RAM (Random Access Memory), ROM (Read Only Memory) or FLASH memory.

The reason that the third embodiment is suitable for execution of a runtime test is because the entire execution of a scan test can be carried out by circuits included in the semiconductor device (1D). To be more specific, before initiating a runtime test (scan test), the system controller (103) sets the values of the scan shift number of times register (2001) and the test pattern number register (2006) in the test control device (200). For example, those values are prestored in the memory device (104). The system controller (103) reads the values from the memory device (104), and outputs the read values to the test control device (200). The test control device (200) sets the values that are output from the system controller (103) to the scan shift number of times register (2001) and the test pattern number register (2006).

When initiating a scan test, the system controller (103) outputs an initiation instruction signal that gives an instruction to initiate a scan test to the test pattern read device (102). In response to the initiation instruction signal from the system controller (103), the test pattern read device (102) starts the operation that acquires the scan test data from the memory device (104) and writes them into the FIFO (101).

Then, as described above, when the scan test data is accumulated in the FIFO (101), and the empty signal is negated, a scan test is initiated. In the third embodiment, when the scan test is completed, the test control device (200) outputs a termination signal to the system controller (103), instead of the test result compression device (202). Further, the test result compression device (202) outputs the compressed code generated by the compression circuit (2023) to the system controller (103) at all times. In response to the termination signal from the test control device (200), the system controller (103) acquires the last compressed code that is output from the test result compression device (202). Then, the system controller (103) compares the acquired compressed code with an expected value and thereby determines a test result.

The expected value is prestored, together with the scan test data, in the memory device (104), for example. The system controller (103) then acquires the expected value stored in the memory device (104) and compares it with the compressed code in response to the termination signal from the test control device (200).

As described above, in the third embodiment, the semiconductor device (1D) includes the memory device (104) that stores a plurality of test data. Then, the test pattern read device (102) sequentially writes the plurality of test data stored in the memory device (104) to the FIFO (101). It is thereby possible to carry out the entire execution of a scan test by the circuits included in the semiconductor device (1D). Because another device is not needed to perform a scan test, it is suitable for execution of a runtime test.

Note that, although an example in which the devices (102, 103, 104) are applied to the semiconductor device (1C) shown in FIG. 7 is described above, the present invention is not limited thereto. As a matter of course, the devices (102, 103, 104) may be applied to the semiconductor devices (1A, 1B) shown in FIGS. 1 and 2.

Modified Example of Third Embodiment

Figure 12:
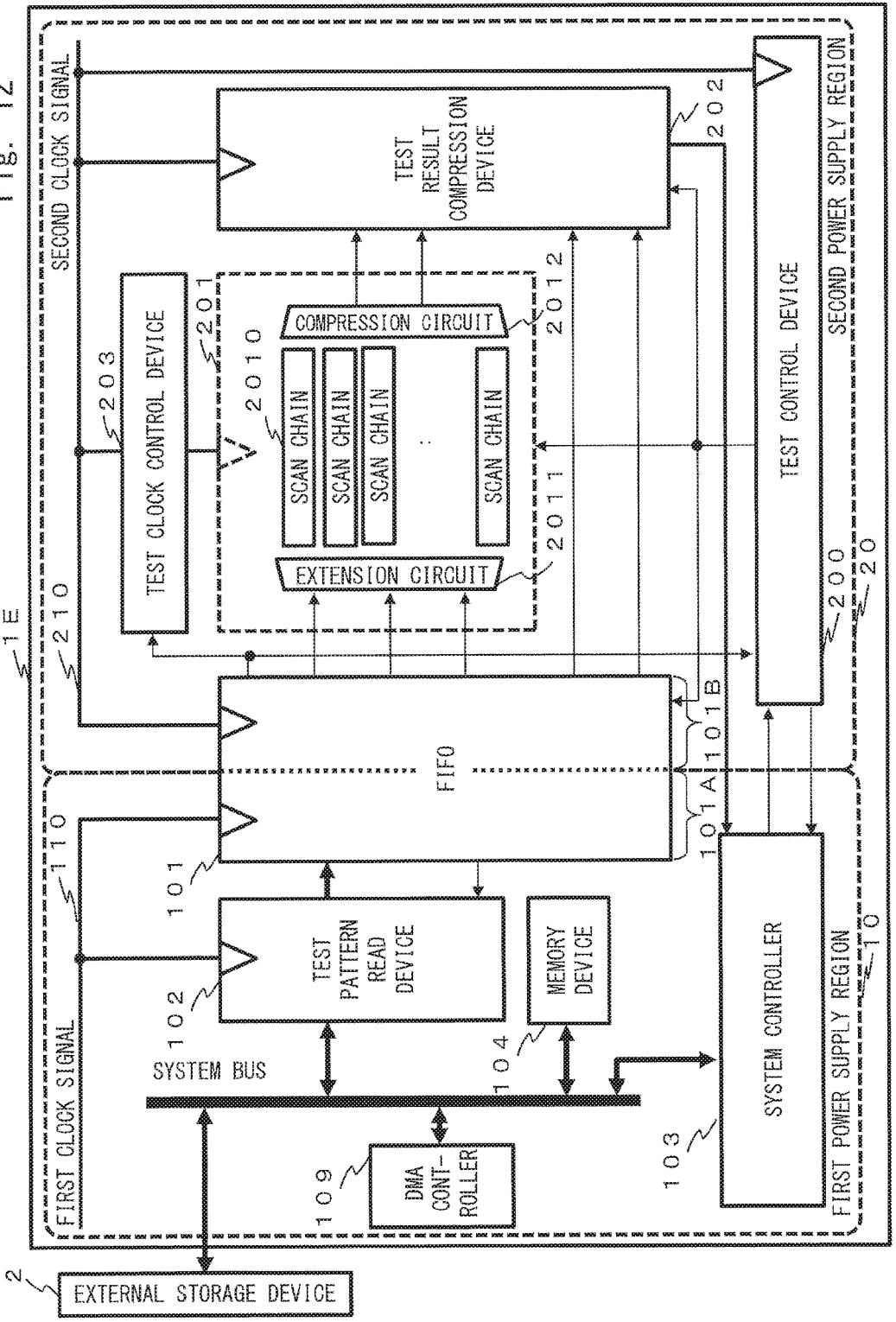
FIG. 12 is a schematic diagram of a semiconductor device according to a modified example of the third embodiment.

A semiconductor device (1E) according to a modified example of the third embodiment is described hereinafter with reference to FIG. 12. FIG. 12 is a block diagram showing the semiconductor device (1E) according to the modified example of the third embodiment.

As shown in FIG. 12, the semiconductor device (1E) according to the modified example of the third embodiment is different from the semiconductor device (1D) according to the third embodiment in that it further includes a DMA controller (109). Further, the semiconductor device (1E) according to the modified example of the third embodiment is different from the semiconductor device (1D) according to the third embodiment in that the semiconductor device (1E) is connected to an external storage device (2). Furthermore, the semiconductor device (1E) according to the modified example of the third embodiment is different from the semiconductor device (1D) according to the third embodiment in that the test pattern read device (102), the system controller (103), the memory device (104) and the external storage device (2) are connected through a system bus. The DMA controller (109) is included in the first power supply region (10).

The external storage device (2) is a device that stores all scan test data and expected values for compressed codes of test result data. The external storage device (2) is a nonvolatile storage device such as ROM, FLASH memory or hard disk, for example.

In the semiconductor device (1D) according to the third embodiment shown in FIG. 11, the test pattern read device (102) directly accesses the dedicated memory device (104) (for example, a rewritable storage element such as FLASH memory) in order to read the scan test data. On the other hand, in the semiconductor device (1E) according to the modified example of the third embodiment shown in FIG. 12, the test pattern read device (102) does not directly access the memory device (104), and the scan test data is read through the system bus in accordance with control of the system controller (103).

In the modified example of the third embodiment, before initiating a scan test, the system controller (103) outputs, to the DMA controller (109) through the system bus, a transfer request signal that requests transfer of data from the external storage device (2) to the memory device (104). In response to the transfer request signal, the DMA controller (109) transfers all the scan test data and the expected values stored in the external storage device (2) to the memory device (104) through the system bus. After that, a scan test is performed by using the scan test data stored in the memory device (104) in the same manner as in the third embodiment described above, and the description thereof is omitted.

One advantage of the modified example of the third embodiment is to be able to use a general-purpose RAM as the memory device (104) and store the scan data in the external storage device (2) of the semiconductor device (1E). The RAM is SRAM (Static RAM), DRAM (Dynamic RAM) or the like, for example. This is because the scan test mechanism that is located in the second power supply region (20) can operate totally independently of reading of the scan test data by the test pattern read device (102), as described in the second embodiment.

As described above, in the modified example of the third embodiment, the system controller (103) and the DMA controller (109) acquire a plurality of test data from the external storage device (2) that is connected to the semiconductor device (1E) and stores the test data into the memory device (104). It is thereby possible to easily change the scan test data simply by replacing the external storage device (2) that is connected outside the semiconductor device (1E), not the memory device (104) included in the semiconductor device (1E). Thus, according to the modified example of the third embodiment, it is possible to reduce the operating cost for replacement of the scan test data. Further, because it is not necessary to place a storage device (the memory device (104)) that stores all scan test data inside the semiconductor device (1E), it is possible to reduce the area overhead in the semiconductor device.

Note that, although an example in which the above-described devices (102, 103, 104, 109, 2) are applied to the semiconductor device (1C) shown in FIG. 7 is described above, the present invention is not limited thereto. As a matter of course, the above-described devices (102, 103, 104, 109, 2) may be applied to the semiconductor devices (1A, 1B) shown in FIGS. 1 and 2.

Fourth Embodiment

A fourth embodiment is described hereinbelow. In the following description of the fourth embodiment, the same elements as in the modified example of the third embodiment described above are denoted by the same reference symbols or the like, and the description of the same is omitted as appropriate.

[Overall Configuration]

Figure 13:
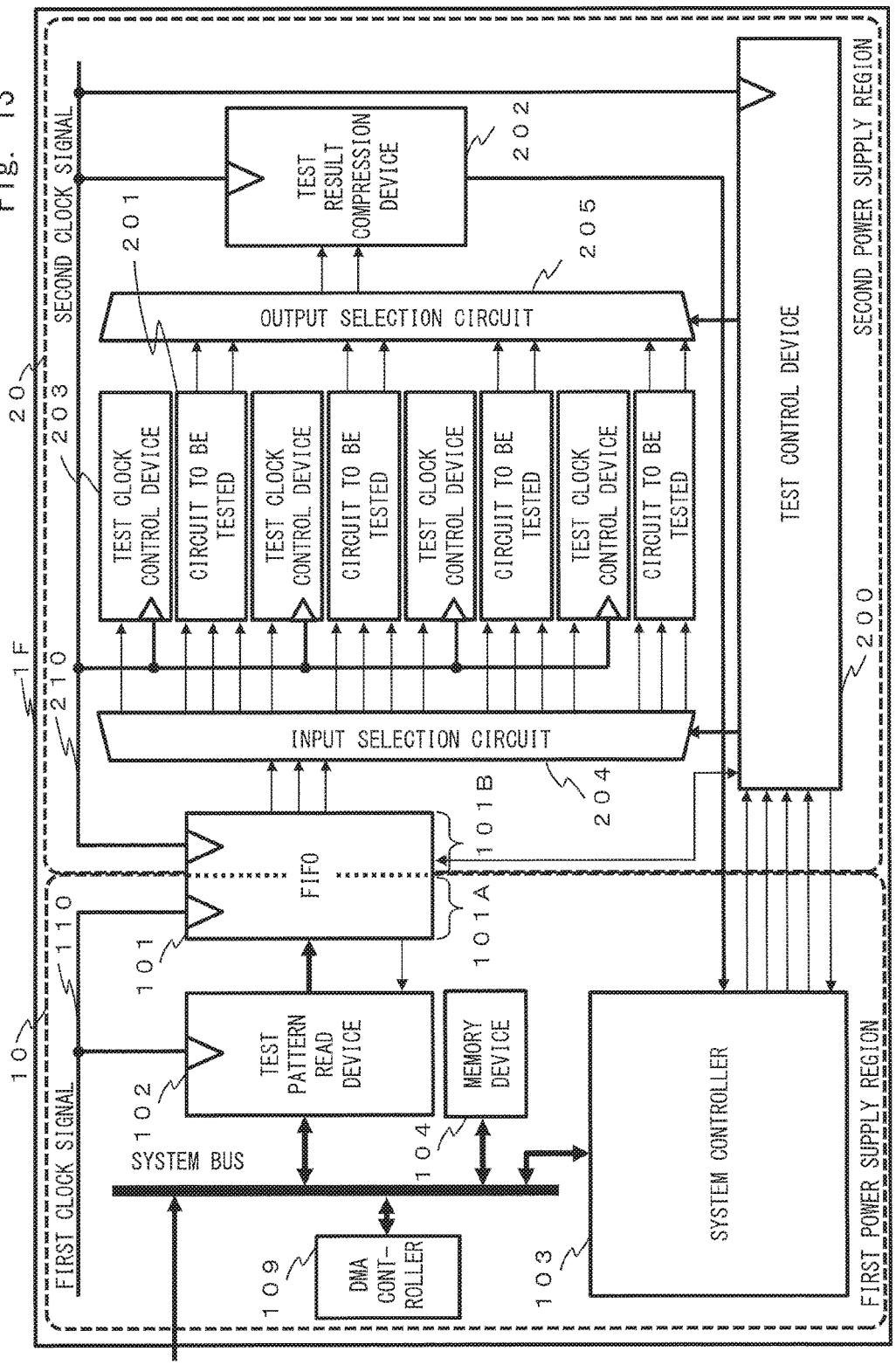
FIG. 13 is a schematic diagram of a semiconductor device according to a fourth embodiment.

The configuration of a semiconductor device (1F) according to the fourth embodiment is described hereinafter with reference to FIG. 13. FIG. 13 is a block diagram of the semiconductor device (1F) according to the fourth embodiment. The semiconductor device (1F) according to the fourth embodiment is an embodiment that is suitable for execution of a runtime test with use of a scan test mechanism in a circuit composed of a plurality of CPU cores (the circuits to be tested (201)), for example. Note that, in FIG. 13, the illustration of the external storage device (2) is omitted.

As shown in FIG. 13, the semiconductor device (1F) according to the fourth embodiment is different from the semiconductor device (1E) according to the modified example of the third embodiment in that it include a plurality of circuits to be tested (201) and a plurality of test clock control devices (203), and further includes an input selection circuit (204) and an output selection circuit (205). The input selection circuit (204) and the output selection circuit (205) are included in the second power supply region (20).

Specifically, in the fourth embodiment, there are a plurality of pairs of circuits to be tested (201) and test clock control devices (203), so that one circuit to be tested (201) and one test clock control device (203) correspond to each other. In the fourth embodiment, an example in which there are four pairs of the circuit to be tested (201) and the test clock control device (203) is described as shown in FIG. 13.

Devices and circuits that are placed in the first power supply region (10) are driven by a first clock signal (110), and devices and circuits that are placed in the second power supply region (20) are driven by a second clock signal (210), just like in the above-described embodiments.

In the fourth embodiment, the FIFO (101) and any one pair of the circuit to be tested (201) and the test clock control device (203), out of the plurality of pairs of the circuits to be tested (201) and the test clock control devices (203), are electrically connected through the input selection circuit (204). Specifically, the input selection circuit (204) is a circuit that selectively connects the FIFO (101) with any one pair of the circuit to be tested (201) and the test clock control device (203) among the plurality of pairs of the circuits to be tested (201) and the test clock control devices (203).

Thus, the scan test data that is output from the FIFO (101) is input to one circuit to be tested (201) which is selected by the input selection circuit (204) from the plurality of circuits to be tested (201). Further, the empty signal that is output from the FIFO (101) is input to one test clock control device (203) which is selected by the input selection circuit (204) from the plurality of test clock control devices (203).

Further, the circuit to be tested (201) and the test clock control device (203) in any one pair among the plurality of pairs of the circuits to be tested (201) and the test clock control devices (203) are electrically connected to the test result compression device (202) through the output selection circuit (205). Specifically, the output selection circuit (205) is a circuit that selectively connects the test result compression device (202) with any one pair of the circuit to be tested (201) among the plurality of pairs of the circuits to be tested (201) and the test clock control devices (203).

Thus, the test result data that is output from one circuit to be tested (201) which is selected by the output selection circuit (205) from the plurality of circuits to be tested (201) is input to the test result compression device (202).

The test control device (200) controls the input selection circuit (204) and the output selection circuit (205) so as to select one pair of the circuit to be tested (201) and the test clock control device (203) on which a scan test is to be performed.

Further, the test clock control device (203) is electrically connected to the circuit to be tested (201) which is paired with this test clock control device (203). Specifically, each of the plurality of test clock control devices (203) supplies a scan test clock to the circuit to be tested (201) which is paired with itself among the plurality of circuits to be tested (201).

[Operation Flow]

Figure 14:
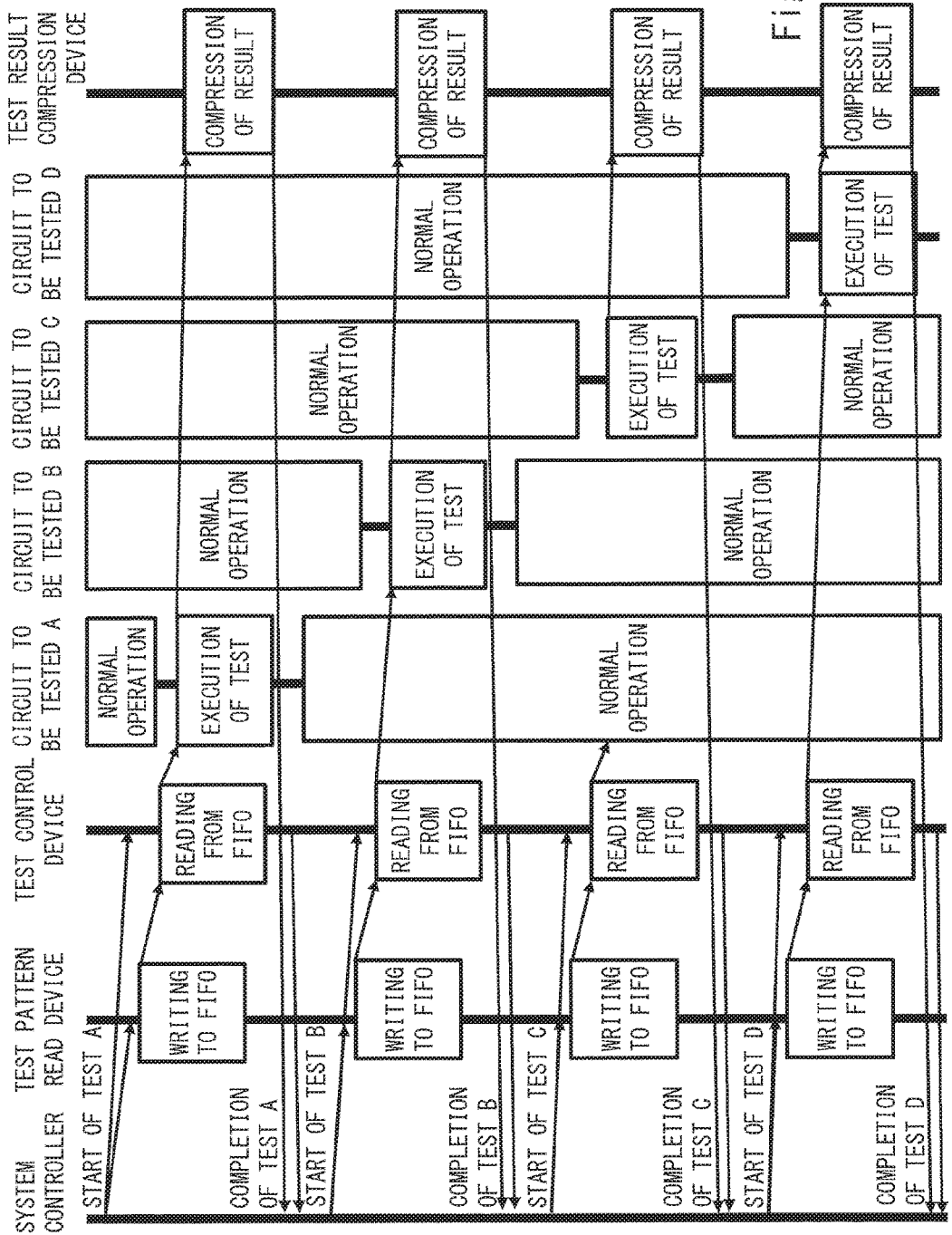
FIG. 14 is a flowchart showing the operation of the semiconductor device according to the fourth embodiment.

The operation of the semiconductor device (1F) according to the fourth embodiment is described hereinafter with reference to FIG. 14. FIG. 14 is an operational flowchart showing the operation of the semiconductor device (1F)

according to the fourth embodiment. In FIG. 14, the vertical line indicates operations of a circuit or a device whose name is shown at its top, and the time elapses from top to bottom. The lateral arrow means that the operational event of a circuit or a device at the starting point of the arrow causes the occurrence of the operational event of a circuit or a device at the end point of the same.

Each of "circuit to be tested A" to "circuit to be tested D" in FIG. 14 indicates any one of the four pairs of the circuits to be tested (201) and the test clock control devices (203) in FIG. 13. The operation of the semiconductor device (1F) according to the fourth embodiment is described hereinafter with reference to the example of the semiconductor device (1F) shown in FIG. 13 and the operation flow shown in FIG. 14.

First, the system controller (103) controls the DMA controller (109) to acquire the scan test data and the expected value for the circuit to be tested A from the external storage device (2) and stores them into the memory device (104). As shown in FIG. 14, the system controller (103) first gives the test pattern read device (102) and the test control device (200) an instruction to initiate a scan test of the circuit to be tested A.

Specifically, the system controller (103) outputs an initiation instruction signal that gives an instruction to initiate a scan test of the circuit to be tested A to the test pattern read device (102). In response to the initiation instruction signal that gives an instruction to initiate a scan test of the circuit to be tested A, the test pattern read device (102) acquires the scan test data of the circuit to be tested (201) corresponding to the circuit to be tested A from the memory device (104) through the system bus, and writes them into the FIFO (101).

Further, the system controller (103) outputs a test initiation signal that gives a notification about initiation of a scan test of the circuit to be tested A to the test control device (200). To be more specific, four test initiation signal lines respectively corresponding to the circuit to be tested A to the circuit to be tested D are connected between the system controller (103) and the test control device (200). The system controller (103) asserts the test initiation signal corresponding to the circuit to be tested A.

In response to assertion of the test initiation signal corresponding to the circuit to be tested A, the test control device (200) outputs a selection instruction signal that gives an instruction to select the circuit to be tested A and the test clock control device (203) which is paired with that circuit to the input selection circuit (204) and the output selection circuit (205). In response to the selection instruction signal, the input selection circuit (204) electrically connects the circuit to be tested A and the test clock control device (203) which is paired with that circuit to the FIFO (101). Further, in response to the selection instruction signal, the output selection circuit (205) electrically connects the circuit to be tested A and the test clock control device (203) which is paired with that circuit to the test result compression device (202).

After that, a scan test is performed on the circuit to be tested A. Note that the operation of the scan test is the same as the third embodiment and its modified example, and the description thereof is omitted.

In this example, during the scan test of the circuit to be tested A, the test control device (200) outputs the scan enable signal that is asserted in response to the empty signal only to the circuit to be tested A, which is a test target, and does not output it to the other circuits to be tested B to D among the plurality of circuits to be tested (201). Specifically, the negated scan enable signal is output to the circuits to be tested B to D, which are not a test target. The scan shift operation is thereby not performed on the circuits to be tested (201) which are not a test target, and the normal operation is performed thereon.

When the scan test of the circuit to be tested A ends, the test control device (200) notifies the system controller (103) of termination of the scan test of the circuit to be tested A, which is a test target. Specifically, in the fourth embodiment, when the scan test ends, the test control device (200) outputs a termination signal that gives a notification about termination of the scan test of the circuit to be tested A on which the scan test is terminated. In response to the termination signal, the system controller (103) compares the compressed code acquired from the test result compression device (202) with the expected value corresponding to the circuit to be tested A for which the termination is notified by the termination signal, and thereby determines a test result.

After that, as shown in FIG. 14, a scan test is sequentially performed on the circuits to be tested B to D in the same manner as described above. Specifically, the scan test data and the expected value for the circuit to be tested B are read from the external storage device (2) to the memory device (104) next. Note that, when the scan test data and the expected value for the circuit to be tested B are the same as those for the circuit to be tested A, this reading may be skipped. The system controller (103) outputs a test initiation signal, designating the circuit to be tested B as a test target, and the input selection circuit (204) and the output selection circuit (205) select the circuit to be tested B and the test clock control device (203) which is paired with that circuit. A scan test of the circuit to be tested B is thereby carried out.

Then, by the termination signal, the system controller (103) is notified of the termination of the scan test of the circuit to be tested B. The system controller (103) compares the compressed code acquired from the test result compression device (202) corresponding to the circuit to be tested B and the expected value for the circuit to be tested B, which is a test target, and determines a test result. After that, the same operation is performed on the circuit to be tested C as a test target, and the same operation is performed on the circuit to be tested D as a test target.

Note that, after execution of a scan test up to the circuit to be tested D is completed, a scan test on the circuits to be tested A to D may be performed again. In other words, a scan test on the circuits to be tested A to D may be repeated. Note that, although an example of performing a scan test of the four circuits to be tested (201) is described in the fourth embodiment, the number of circuits to be tested (201) is not limited thereto.

As described above, in the fourth embodiment, the input selection circuit (204) selects the circuit to be tested (201) which is specified by the test control device (200) from among the plurality of circuits to be tested (201) as a circuit to which the test data read from the FIFO (101) is to be input. Further, the output selection circuit (205) selects the circuit to be tested (201) which is specified by the test control device (200) from among the plurality of circuits to be tested (201) as a circuit from which the test result data is to be output to the test result compression device (202). It is thereby possible to perform a scan test of only the circuit to be tested (201) which is selected as a test target and continue the processing on the circuits to be tested (201) which are not selected as a test target. It is thus possible to perform a scan test of the circuit to be tested (201) without stopping the system.

Note that, although an example in which a plurality of pairs of the circuits to be tested (201) and the test clock control devices (203) are included in the semiconductor device (1E) shown in FIG. 12 is described above, the present invention is not limited thereto. As a matter of course, a plurality of pairs of the circuits to be tested (201) and the test clock control devices (203) may be included in the semiconductor devices (1A, 1B, 1C, 1D) shown in FIGS. 1, 2, 7 and 11.

Fifth Embodiment

A fifth embodiment is described hereinbelow. In the following description of the fifth embodiment, the same elements as in the modified example of the third embodiment described above are denoted by the same reference symbols or the like, and the description of the same is omitted as appropriate.

[Overall Configuration]

Figure 15:
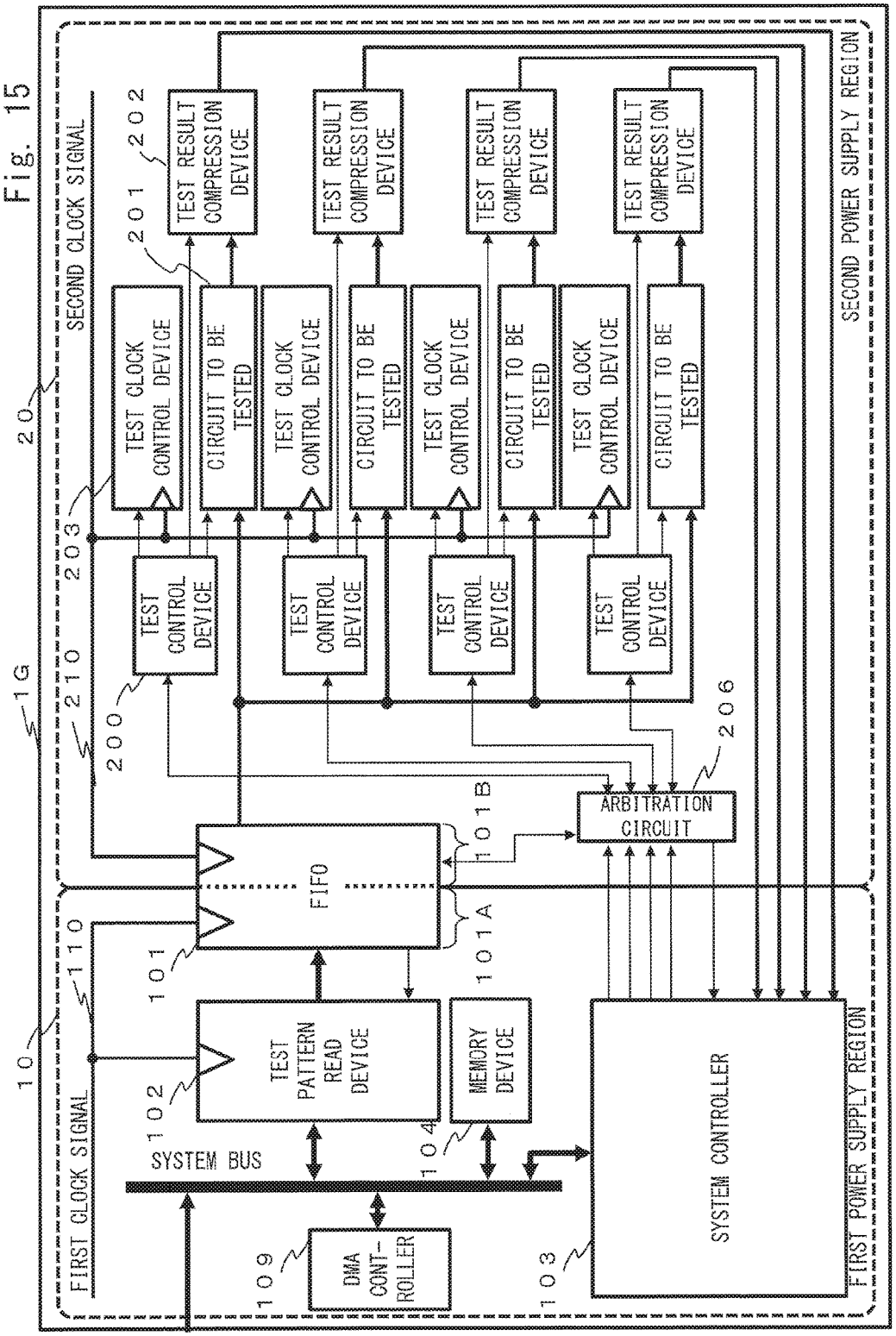
FIG. 15 is a schematic diagram of a semiconductor device according to a fifth embodiment.

The configuration of a semiconductor device (1G) according to the fifth embodiment is described hereinafter with reference to FIG. 15. FIG. 15 is a block diagram of the semiconductor device (1G) according to the fifth embodiment. The semiconductor device (1G) according to the fifth embodiment is an embodiment that is suitable for execution of a runtime test with use of a scan test mechanism in a circuit composed of a plurality of CPU cores (the circuits to be tested (201)), for example. Note that, in FIG. 15, the illustration of the external storage device (2) is omitted.

As shown in FIG. 15, the semiconductor device (1G) according to the fifth embodiment is different from the semiconductor device (1E) according to the modified example of the third embodiment in that it includes a plurality of test control devices (200), a plurality of circuits to be tested (201), a plurality of test result compression devices (202), and a plurality of test clock control devices (203), and further includes an arbitration circuit (206). The arbitration circuit (206) is included in the second power supply region (20).

Specifically, in the fifth embodiment, there are a plurality of pairs of the test control devices (200), the circuits to be tested (201), the test result compression devices (202) and the test clock control devices (203), so that one test control devices (200), one circuit to be tested (201), one test result compression device (202) and one test clock control device (203) correspond to one another. In the fifth embodiment, an example in which there are four pairs of the test control devices (200), the circuits to be tested (201), the test result compression devices (202) and the test clock control devices (203) is described as shown in FIG. 15.

Devices and circuits that are placed in the first power supply region (10) are driven by a first clock signal (110), and devices and circuits that are placed in the second power supply region (20) are driven by a second clock signal (210), just like in the above-described embodiments.

In the fifth embodiment, the FIFO (101) is electrically connected to the plurality of circuits to be tested (201) and the arbitration circuit (206). Thus, in the fifth embodiment, the FIFO (101) outputs the empty signal to the arbitration circuit (206).

Further, the system controller (103) is electrically connected to the arbitration circuit (206) and the plurality of test result compression devices (202). Thus, the system controller (103) outputs the test initiation signal to the arbitration circuit (206).

The plurality of test control devices (200) and the plurality of test clock control devices (203) are connected to the arbitration circuit (206). Specifically, each of the plurality of test control devices (200) outputs the scan enable signal to the arbitration circuit (206). The arbitration circuit (206) outputs the scan enable signal that is output from the test control device (200) corresponding to the circuit to be tested (201) as a test target, among the scan enable signals that are output from the plurality of test control devices (200), as output from the read signal to the FIFO (101). Further, the arbitration circuit (206) outputs the empty signal to the test clock control device (203) corresponding to the circuit to be tested (201) as a test target, among the plurality of test clock control devices (203). Note that the arbitration circuit (206) recognizes the circuit to be tested (201) which is specified as a test target by the test initiation signal as the test target circuit to be tested (201).

The arbitration circuit (206) is a circuit that arbitrates signals that are input and output between circuits or devices connected to the arbitration circuit (206).

Further, the electrical connections among the control device (200), the circuit to be tested (201), the test result compression device (202) and the test clock control device (203) included in the same pair are the same as those in the modified example of the third embodiment.

[Operation Flow]

Figure 16:
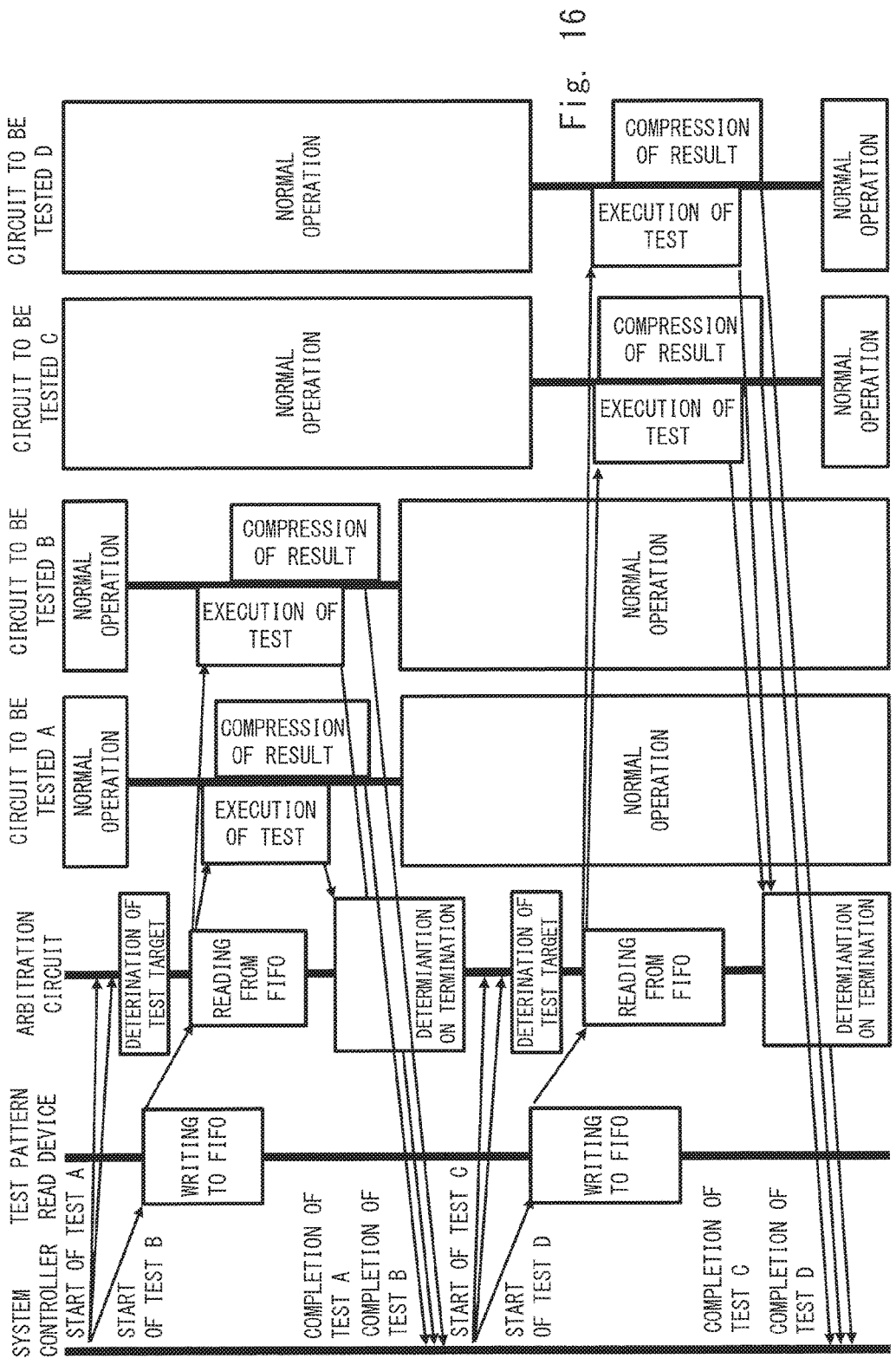
FIG. 16 is a flowchart showing the operation of the semiconductor device according to the fifth embodiment.

The operation of the semiconductor device (1G) according to the fifth embodiment is described hereinafter with reference to FIG. 16. FIG. 16 is an operational flowchart showing the operation of the semiconductor device (1G) according to the fifth embodiment. In FIG. 16, the vertical line indicates operations of a circuit or a device whose name is shown at its top, and the time elapses from top to bottom. The lateral arrow means that the operational event of a circuit or a device at the starting point of the arrow causes the occurrence of the operational event of a circuit or a device at the end point of the same.

Each of "circuit to be tested A" to "circuit to be tested D" in FIG. 16 indicates any one of the four circuits to be tested (201) in FIG. 15. The operation of the semiconductor device (1G) according to the fifth embodiment is described hereinafter with reference to the example of the semiconductor device (1G) shown in FIG. 15 and the operation flow shown in FIG. 16.

First, the system controller (103) controls the DMA controller (109) to acquire the scan test data and the expected value for the circuit to be tested A and the circuit to be tested B from the external storage device (2), and stores them into the memory device (104). It is assumed that the scan test data and the expected value for each of the circuit to be tested A and the circuit to be tested B are the same. Specifically, the scan test data that is common to the circuit to be tested A and the circuit to be tested B is stored into the memory device (104). As shown in FIG. 16, the system controller (103) first gives the test pattern read device (102) and the test control device (200) an instruction to initiate a scan test of the circuit to be tested A and the circuit to be tested B.

Specifically, the system controller (103) outputs an initiation instruction signal that gives an instruction to initiate a scan test of the circuit to be tested A and the circuit to be tested B to the test pattern read device (102). In response to the initiation instruction signal that gives an instruction to initiate a scan test of the circuit to be tested A and the circuit to be tested B, the test pattern read device (102) acquires the scan test data corresponding to the circuit to be tested A and the circuit to be tested B from the memory device (104) through the system bus, and writes them into the FIFO (101).

Further, the system controller (103) outputs a test initiation signal that gives a notification about initiation of a scan test of the circuit to be tested A and the circuit to be tested B to the arbitration circuit (206). To be more specific, four test initiation signal lines respectively corresponding to the circuit to be tested A to the circuit to be tested D are connected between the system controller (103) and the arbitration circuit (206). The system controller (103) asserts the test initiation signals corresponding to the circuit to be tested A and the circuit to be tested B.

When the empty signal that is input from the FIFO (101) is negated, the arbitration circuit (206) outputs the negated empty signal to each of the test control devices (200) corresponding to the circuit to be tested A and the circuit to be tested B among the plurality of test control devices (200).

At the point of time when a specified time elapses after any test initiation signal is asserted, the arbitration circuit (206) outputs the negated empty signal to the test control device (200) corresponding to the asserted test initiation signal. Because the four test initiation signals are transmitted in an asynchronous manner, the test initiation signals asserted at different timings reach the arbitration circuit (206) in some cases. In this case also, by waiting for the test initiation signals for a specified period of time as described above, it is possible to equalize the timing when the negated empty signal reaches the test control devices (200) corresponding to the circuits to be tested A, B as test targets.

A scan test is thereby performed on the circuit to be tested A and the circuit to be tested B simultaneously in parallel as shown in FIG. 16. Thus, the scan test data that is output from the FIFO (101) is simultaneously input to the circuit to be tested A and the circuit to be tested B. Note that the operation of the scan test is the same as the third embodiment and its modified example, and the description thereof is omitted. Because the test control devices (200) corresponding to the circuit to be tested C and the circuit to be tested D do not perform a scan test on the circuit to be tested C and the circuit to be tested D, the circuit to be tested C and the circuit to be tested D perform the normal operation.

As described above, the arbitration circuit (206) outputs the empty signal from the FIFO (101) only to the test clock control device (203) corresponding to the circuit to be tested (201) as a test target. Thus, when the FIFO (101) becomes empty, supply of the second clock signal (210) to the circuit to be tested (201) is stopped only by the test clock control device (203) corresponding to the test target circuit to be tested (201).

Further, as described above, the arbitration circuit (206) outputs, as the read signal to the FIFO (101), the scan enable signal that is output only from the test control device (200) corresponding to the test target circuit to be tested (201). Therefore, a register in the register group (34) of the FIFO (101) from which data is to be read is updated depending on whether the test target circuit to be tested (201) performs the scan shift operation or not. Note that, because each of the test control devices (200) corresponding to the circuit to be tested A and the circuit to be tested B outputs similar scan enable signals, the scan enable signal from any one of those test control devices (200) may be output to the FIFO (101).

When a scan test of the circuit to be tested A and the circuit to be tested B ends, each of the test control devices (200) corresponding to the circuit to be tested A and the circuit to be tested B gives the arbitration circuit (206) a notification about termination of the scan test. Specifically, each of the test control devices (200) corresponding to the circuit to be tested A and the circuit to be tested B outputs a termination signal to the arbitration circuit (206). In response to the termination signal, the arbitration circuit (206) outputs a termination signal that gives a notification about termination of the scan test of the circuit to be tested A and the circuit to be tested B to the system controller (103). Note that the arbitration circuit (206) outputs the termination signal to the system controller (103) after waiting for the termination signals from all of the test control devices (200) corresponding to the circuit to be tested A and the circuit to be tested B for which an instruction for initiation of the scan test has been given from the system controller (103).

In response to the termination signal, the system controller (103) compares each of the compressed codes acquired from the test result compression devices (202) corresponding to the circuit to be tested A and the circuit to be tested B with the expected value corresponding to the circuit to be tested A and the circuit to be tested B, and thereby determines a test result.

After that, as shown in FIG. 16, a scan test is performed also on the circuits to be tested C, D in the same manner. Specifically, the scan test data and the expected value for the circuits to be tested C, D are read from the external storage device (2) to the memory device (104) next. Note that, when the scan test data and the expected value for the circuits to be tested C, D are the same as those for the circuits to be tested A, B, this reading may be skipped. The test initiation signal is output, designating the circuit to be tested C and the circuit to be tested D as a test target, and the arbitration circuit (206) makes control so that a scan test is performed on the circuit to be tested C and the circuit to be tested D. Then, by the termination signal, the termination of a scan test of the circuit to be tested C and the circuit to be tested D is notified to the system controller (103) through the arbitration circuit (206). The system controller (103) compares each of the compressed codes acquired from the test result compression devices (202) corresponding to the circuit to be tested C and the circuit to be tested D with the expected values corresponding to the circuit to be tested C and the circuit to be tested D, and thereby determines a test result.

Note that, after execution of a scan test up to the circuits to be tested C, D is completed, a scan test on the circuits to be tested A to D may be performed again. In other words, a scan test on the circuits to be tested A to D may be repeated. Note that, although an example of performing a scan test of the four circuits to be tested (201) is described in the fourth embodiment, the number of circuits to be tested (201) is not limited thereto.

Note that, although an example of performing a scan test of the two circuits to be tested (201) each time is described in the fifth embodiment, the number of circuits to be tested (201) on which a scan test is performed simultaneously is not limited thereto.

Further, although an example in which the configurations of all the circuits to be tested A to D are the same and the scan test data is the same is described above, the scan test data may be different for each of the circuits to be tested A to D. Note that, however, in the case of using different scan test data for each of the circuits to be tested on which a scan test is performed simultaneously, the semiconductor device (1G) needs to include different FIFOs (101) for each of the circuits to be tested. For example, in the case where the configurations of the circuit to be tested A and the circuit to be tested B on which a scan test is performed simultaneously are different, and the scan test data used for them are different, it is necessary to prepare FIFOs (101) respectively corresponding to the circuit to be tested A and the circuit to be tested B. Specifically, the scan test data for the circuit to be tested A is stored in the FIFO (101) corresponding to the circuit to be tested A, and the scan test data for the circuit to be tested B is stored in the FIFO (101) corresponding to the circuit to be tested B.

As described above, in the fifth embodiment, the system controller (103) gives an instruction to perform a scan test of any two or more circuits to be tested (201) among the plurality of circuits to be tested (201). Then, the arbitration circuit (206) gives an instruction to perform a scan test to the two or more test control devices (200) corresponding to the two or more circuits to be tested (201) specified by the system controller (103). It is thereby possible to perform a scan test simultaneously on the plurality of circuits to be tested (201). Further, it is possible to continue the processing for the circuits to be tested (201) which are not a test target, just like in the fourth embodiment.

Although an example in which the semiconductor device (1E) shown in FIG. 12 includes a plurality of pairs of the test control devices (200), the circuits to be tested (201), the test result compression devices (202) and the test clock control devices (203) is described above, the present invention is not limited thereto. As a matter of course, the semiconductor devices (1A, 1B, 1C, 1D) shown in FIGS. 1, 2, 7 and 11 may include a plurality of pairs of the test control devices (200), the circuits to be tested (201), the test result compression devices (202) and the test clock control devices (203).

Sixth Embodiment

A sixth embodiment is described hereinbelow. In the following description of the sixth embodiment, the same elements as in the modified example of the third embodiment described above are denoted by the same reference symbols or the like, and the description of the same is omitted as appropriate.

[Overall Configuration]

Figure 17:
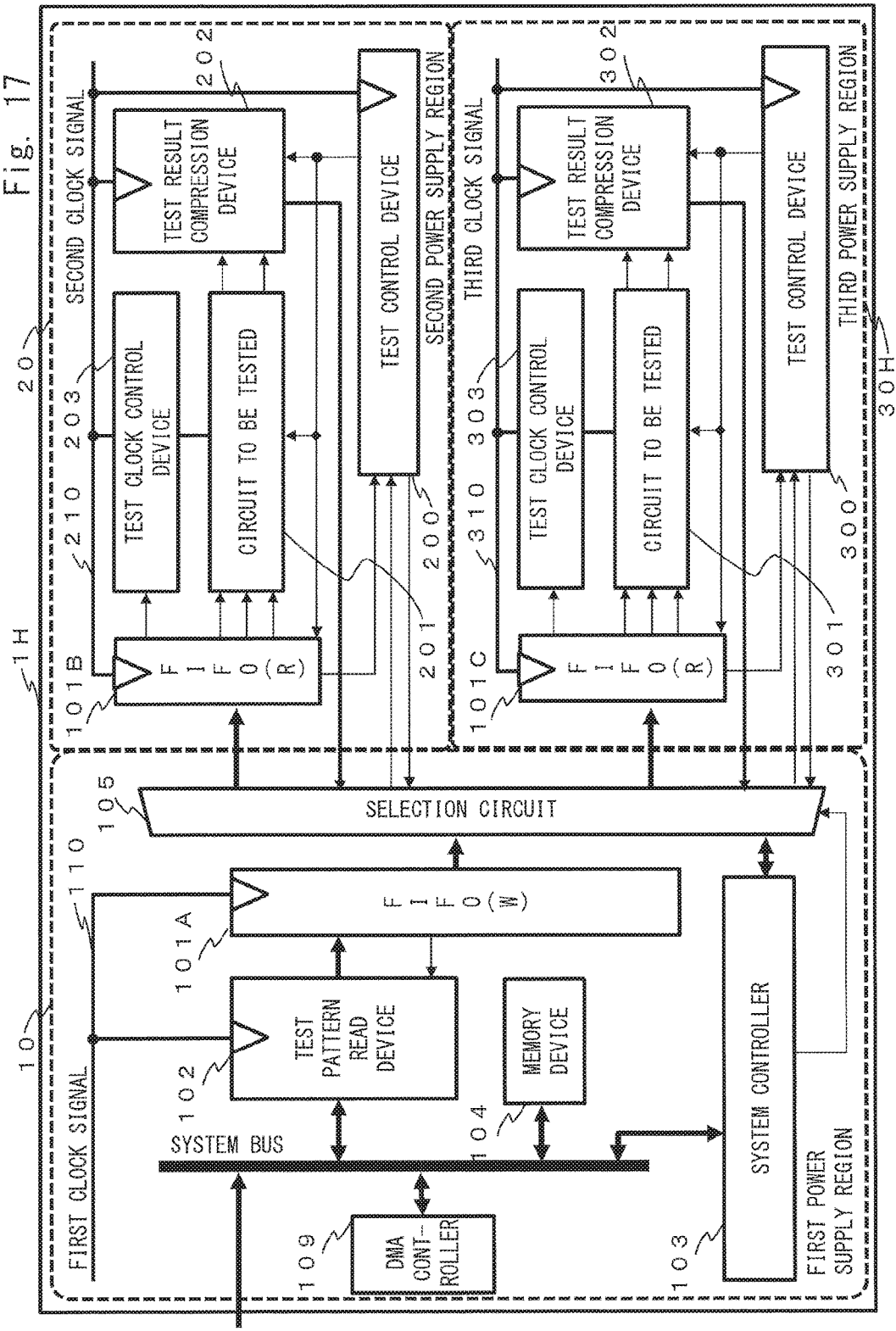
FIG. 17 is a schematic diagram of a semiconductor device according to a sixth embodiment.

The configuration of a semiconductor device (1H) according to the sixth embodiment is described hereinafter with reference to FIG. 17. FIG. 17 is a block diagram of the semiconductor device (1H) according to the sixth embodiment. The semiconductor device (1H) according to the sixth embodiment is an embodiment that is suitable for the case where there are a plurality of targets of a runtime test, for example. Note that, in FIG. 17, the illustration of the external storage device (2) is omitted.

As shown in FIG. 17, the semiconductor device (1H) according to the sixth embodiment is different from the semiconductor device (1E) according to the modified example of the third embodiment in that it further includes a selection circuit (105), a functional block for FIFO reading (101C), a test control device (300), a circuit to be tested (301), a test result compression device (302), and a test clock control device (303). Further, the semiconductor device (1H) according to the sixth embodiment is different from the semiconductor device (1E) according to the modified example of the third embodiment in that it includes a third power supply region (30H).

The selection circuit (105) is included in the first power supply region (10), and the functional block for FIFO reading (101C), the test control device (300), the circuit to be tested (301), the test result compression device (302), and the test clock control device (303) are included in the third power supply region (30H).

The third power supply region (30H) has different power supply lines from the first power supply region (10) and the second power supply region (20). Thus, the third power supply region (30H) can supply different power, independently of the first power supply region (10) and the second power supply region (20). For example, the third power supply region (30H) is the DVFS region.

Devices and circuits that are placed in the first power supply region (10) are driven by the first clock signal (110), and devices and circuits that are placed in the second power supply region (20) are driven by the second clock signal (210). Further, devices and circuits that are placed in the third power supply region (30H) are driven by a third clock signal (310).

It is assumed that the third clock signal (310) and each of the first clock signal (110) and the second clock signal (210) are not synchronous (at least one of the frequency and the phase is different) since voltages are different between the third power supply region (30H) and each of the first power supply region (10) and the second power supply region (20). Note that, alternatively, the first clock signal (110), the second clock signal (210) and the third clock signal (310) may be asynchronous with one another since they are clock signals generated by different clock generation circuits.

Hereinafter, a functional block for FIFO writing (101A) and functional blocks for FIFO reading (101B, 101C) are also referred as a functional block (101A), a functional block (101B) and a functional block (101C), respectively.

In the sixth embodiment, the functional block (101A) is electrically connected, through the selection circuit (105), to one functional block which is selected by the selection circuit (105) from among the functional block (101B) and the functional block (101C).

Further, the system controller (103) is electrically connected, through the selection circuit (105), to one test control device and one test result compression device which is selected by the selection circuit (105) from among the test control device (200) and the test result compression device (202) or the test control device (300) and the test result compression device (302).

The operation and connections of the elements (101C, 300, 301, 302, 303) included in the third power supply region (30H) are substantially the same as the operation and connections of the elements (101B, 200, 201, 202, 203) included in the second power supply region (20), and the description thereof is omitted. Note that, however, the elements (101C, 300, 301, 302, 303) included in the third power supply region (30H) operate based on the third clock signal (310), not on the second clock signal (210).

[Operation Flow]

Figure 18:
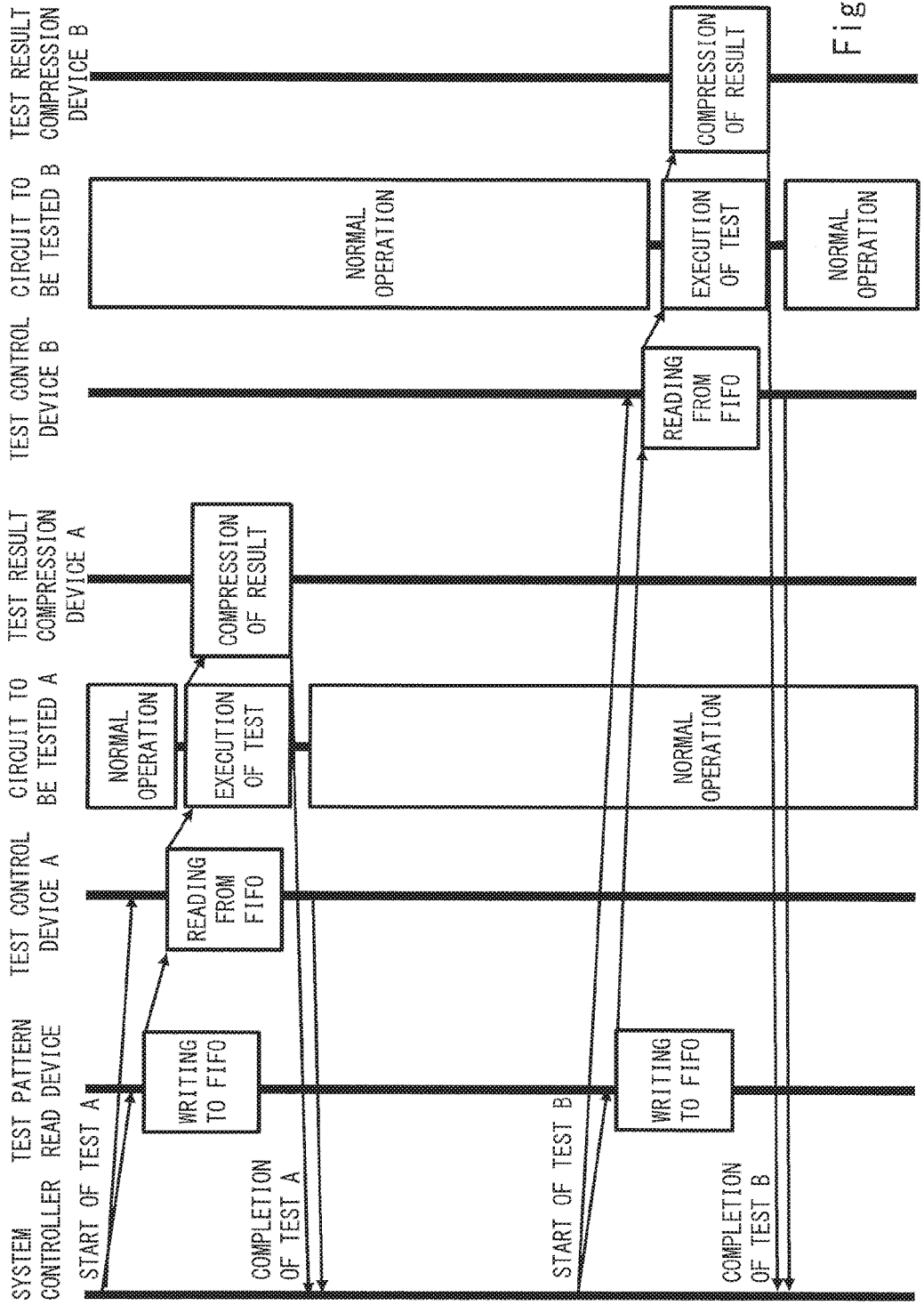
FIG. 18 is a flowchart showing the operation of the semiconductor device according to the sixth embodiment.

The operation of the semiconductor device (1H) according to the sixth embodiment is described hereinafter with reference to FIG. 18. FIG. 18 is an operational flowchart showing the operation of the semiconductor device (1H) according to the sixth embodiment. In FIG. 18, the vertical line indicates operations of a circuit or a device whose name is shown at its top, and the time elapses from top to bottom. The lateral arrow means that the operational event of a circuit or a device at the starting point of the arrow causes the occurrence of the operational event of a circuit or a device at the end point of the same.

Each of "circuit to be tested A" and "circuit to be tested B" in FIG. 18 indicates any one of the two circuit to be tested (201) and circuit to be tested (301) in FIG. 17. The operation of the semiconductor device (1H) according to the sixth embodiment is described hereinafter with reference to the example of the semiconductor device (1H) shown in FIG. 17 and the operation flow shown in FIG. 18.

First, the system controller (103) controls the DMA controller (109) to acquire the scan test data and the expected value for the circuit to be tested A from the external storage device (2) and stores them into the memory device (104). As shown in FIG. 18, the system controller (103) first gives the test pattern read device (102) an instruction to initiate a scan test of the circuit to be tested A.

Specifically, the system controller (103) outputs an initiation instruction signal that gives an instruction to initiate a scan test of the circuit to be tested A to the test pattern read device (102). In response to the initiation instruction signal that gives an instruction to initiate a scan test of the circuit to be tested A, the test pattern read device (102) acquires the scan test data corresponding to the circuit to be tested A from the memory device (104) through the system bus, and writes them into the FIFO (101).

Further, the system controller (103) controls the selection circuit (105) so as to select the functional block, the test control device and the test result compression device corresponding to the circuit to be tested A. Specifically, the system controller (103) outputs, to the selection circuit (105), a selection signal for selecting the functional block, the test control device and the test result compression device corresponding to the circuit to be tested A. In response to the selection signal, the selection circuit (105) connects the functional block (101A) to the functional block corresponding to the circuit to be tested A, and connects the system controller (103) to the test control device A and the test result compression device A corresponding to the circuit to be tested A.

Signals (scan test data, gray code value) are thereby transmitted between the functional block (101A) and the functional block corresponding to the circuit to be tested A, out of the functional block (101B) and the functional block (101C). Further, the termination signal that is output from the test control device A corresponding to the circuit to be tested A, out of the test control device (200) and the test control device (300), is input to the system controller (103). Further, the compressed code that is output from the test result compression device A corresponding to the circuit to be tested A, out of the test result compression device (202) and the test result compression device (302), is input to the system controller (103).

Thus, the scan test data is read from the functional block (101A) by one of the functional block (101B) and the functional block (101C) which corresponds to the circuit to be tested A. Accordingly, the functional block corresponding to the circuit to be tested A outputs the negated empty signal to the test control device A. Thus, the initiation signal in the test control device A corresponding to the circuit to be tested A is asserted, and a scan test of the circuit to be tested A is carried out. Note that the operation of the scan test is the same as the operation in the modified example of the third embodiment, and the description thereof is omitted.

When the scan test of the circuit to be tested A ends, the test control device A corresponding to the circuit to be tested A outputs the termination signal to the system controller (103) through the selection circuit (105). In response to the termination signal, the system controller (103) compares the compressed code acquired from the test result compression device A corresponding to the circuit to be tested A with the expected value corresponding to the circuit to be tested A for which the termination is notified by the termination signal, and thereby determines a test result.

After that, as shown in FIG. 18, a scan test is performed also on the circuit to be tested B in the same manner as described above. Specifically, the scan test data and the expected value for the circuit to be tested B are read from the external storage device (2) to the memory device (104) next. Note that, when the scan test data and the expected value for the circuit to be tested B are the same as those for the circuit to be tested A, this reading may be skipped. Further, an instruction to initiate a scan test of the circuit to be tested B is given to the test pattern read device (102), and the selection circuit (105) is controlled so as to select the functional block, the test control device and the test result compression device corresponding to the circuit to be tested B. The initiation signal in the test control device B corresponding to the circuit to be tested B is thereby asserted, and a scan test on the circuit to be tested B is performed in the same way as above.

Note that, after execution of a scan test up to the circuit to be tested B is completed, a scan test on the circuits to be tested A and B may be performed again. In other words, a scan test on the circuits to be tested A and B may be repeated. Note that, although an example of performing a scan test of the two circuits to be tested (201, 301) is described in the sixth embodiment, the number of circuits to be tested (201, 301) is not limited thereto. Specifically, another power supply area which has the same configuration as the second power supply region (20) and the third power supply region (30H) but has a different voltage may be included.

As described above, in the sixth embodiment, the test control device (200) sequentially reads a plurality of test data stored in the FIFO (101) in synchronization with the second clock signal (210), and performs a scan test of the circuit to be tested (201). Further, the test control device (300) sequentially reads a plurality of test data stored in the FIFO (101) in synchronization with the third clock signal (310), and performs a scan test of the circuit to be tested (301). Then, the selection circuit (105) selects any one of the test control device (200) and the test control device (300) as the test control device that performs a scan test. It is thereby possible to perform a scan test of a plurality of circuits to be tested that are synchronous with different clock signals.

Although an example in which the semiconductor device (1E) shown in FIG. 12 includes a plurality of functional blocks for FIFO reading, a plurality of test control devices, a plurality of circuits to be tested, a plurality of test clock control devices, and a plurality of test result compression devices is described above, the present invention is not limited thereto. As a matter of course, the semiconductor devices (1A, 1B, 1C, 1D) shown in FIGS. 1, 2, 7 and 11 may include plurality of functional blocks for FIFO reading, a plurality of test control devices, a plurality of circuits to be tested, a plurality of test clock control devices, and a plurality of test result compression devices.

Seventh Embodiment

One embodiment that is extracted from the above-described first to sixth embodiments is described as a seventh embodiment with reference to FIG. 19. A semiconductor device (9) according to the seventh embodiment is described hereinafter with reference to FIG. 19. FIG. 19 is a schematic diagram of the semiconductor device (9) according to the seventh embodiment.

As shown in FIG. 19, the semiconductor device (9) includes a FIFO (91), a test data write circuit (92), a test control circuit (93), and a circuit to be tested (94).

The test data write circuit (92) sequentially write a plurality of test data into the FIFO (91) in synchronization with a first clock signal (910). The test data write circuit (92) corresponds to the test pattern generation device (100) and the test pattern read device (102). The FIFO (91) corresponds to the FIFO (101). The first clock signal (910) corresponds to the first clock signal (110).

In parallel with writing of the plurality of test data into the FIFO (91) by the test data write circuit (92), the test control circuit (93) sequentially reads a plurality of test data stored in the FIFO (91) in synchronization with a second clock signal (920) which is not synchronous with the first clock signal (910), and performs a scan test of the circuit to be tested (94). The test control circuit (93) corresponds to the test control device (200, 300). The circuit to be tested (94) corresponds to the circuit to be tested (201, 301). The second clock signal (920) corresponds to the second clock signal (210).

Other Embodiments

The first power supply region (10) and the second power supply region (20) are different, and the first clock signal (110) and the second clock signal (210) are not synchronous in the embodiments described above, and they can be generated by the configuration and operation described hereinbelow. The configuration and operation are described hereinafter with reference to FIG. 20. FIG. 20 is a schematic diagram of a semiconductor device (1I) according to another embodiment.

As shown in FIG. 20, the semiconductor device (1I) is different from the semiconductor device (1A) according to the first embodiment in that it further includes a setting circuit (3), a voltage supply circuit (4), and a clock supply circuit (5).

The setting circuit (3) changes the voltage to be supplied from the voltage supply circuit (4) to the second power supply region (20) or the frequency of the second clock signal (210) to be supplied from the clock supply circuit (5) to circuits and devices in the second power supply region (20) in response to an instruction from the circuit to be tested (201).

It is assumed that, in the initial state, the voltage of the first power supply region (10) and the voltage of the second power supply region (20) are the same. This voltage is referred to hereinafter as a first voltage. It is also assumed that, in the initial state, the first clock signal (110) and the second clock signal (210) are synchronous (the frequency and the phase are the same). This frequency is referred to hereinafter as a first frequency.

The circuit to be tested (201) is a CPU, for example, as described above. Thus, the circuit to be tested (201) runs a program and executes arbitrary processing, for example. The circuit to be tested (201) measures the processing load of itself and determines whether the processing load becomes equal to or less than a specified threshold.

When the processing load becomes equal to or less than a specified threshold, the circuit to be tested (201) outputs, to the setting circuit (3), an instruction signal that gives an instruction to change the voltage to be supplied from the voltage supply circuit (4) to the second power supply region (20) or change the frequency of the second clock signal (210) to be supplied from the clock supply circuit (5) to circuits and devices in the second power supply region (20).

In response to the instruction signal that gives an instruction to change the voltage from the circuit to be tested (201), the setting circuit (3) sets the voltage supply circuit (4) so that the voltage to be supplied from the voltage supply circuit (4) to the second power supply region (20) becomes a second voltage, which is lower than the first voltage. In response to this setting, the voltage supply circuit (4) changes the voltage to be supplied to the second power supply region (20) from the first voltage to the second voltage. The voltage of the second power supply region (20) thereby becomes lower than the voltage of the first power supply region (10). As a result, the second clock signal (210) in the second power supply region (20) becomes asynchronous with the first clock signal (110) in the first power supply region (10) due to the effect of a voltage difference.

Further, in response to the instruction signal that gives an instruction to change the frequency from the circuit to be tested (201), the setting circuit (3) sets the clock supply circuit (5) so that the frequency of the second clock signal (210) to be supplied from the clock supply circuit (5) to the second power supply region (20) becomes a second frequency, which is lower than the first frequency. In response to this setting, the clock supply circuit (5) changes the frequency of the second clock signal (210) to be supplied to the second power supply region (20) from the first frequency to the second frequency. The frequency of the second clock signal (210) thereby becomes lower than the frequency of the first clock signal (110).

On the other hand, when the processing load does not become equal to or less than a specified threshold, the circuit to be tested (201) does not give the above-described instruction to change the voltage or the frequency.

Note that, although an example in which the setting circuit (3), the voltage supply circuit (4) and the clock supply circuit (5) are applied to the semiconductor device (1A) shown in FIG. 1 is described above, the present invention is not limited thereto. As a matter of course, the setting circuit (3), the voltage supply circuit (4) and the clock supply circuit (5) may be applied to the second power supply region 20 in the semiconductor devices (1B, 1C, 1D, 1E, 1F, 1G, 1H) shown in FIGS. 2, 7, 11, 12, 13, 15, 17 and the third power supply region 30H in the semiconductor device (1H) shown in FIG. 17.

Although embodiments of the present invention are described in the foregoing, the present invention is not restricted to the above-described embodiments, and various changes and modifications may be made without departing from the scope of the invention.

Although an example in which the test result compression device (202, 302) fixes an indeterminate value in the test result data to "0" (Low) by the mask data is described in each of the embodiments described above, the present invention is not limited thereto. For example, the test result compression device (202, 302) may fix an indeterminate value in the test result data to "1" (High) by the mask data. In this case, the test result compression device (202, 302) may include an OR gate in place of the AND gates (2021, 2022).

REFERENCE SIGNS LIST 1A, 1B, 1C, 1D, 1E, 1F, 1G, 1H, 1I SEMICONDUCTOR DEVICE
2 EXTERNAL STORAGE DEVICE
3 SETTING CIRCUIT
4 VOLTAGE SUPPLY CIRCUIT
5 CLOCK SUPPLY CIRCUIT
10 FIRST POWER SUPPLY REGION
20 SECOND POWER SUPPLY REGION
30H THIRD POWER SUPPLY REGION
30 INPUT CIRCUIT
31 FULL DETERMINATION CIRCUIT
32 GRAY CODE COUNTER
33, 43 SELECTION CIRCUIT
34 REGISTER GROUP
40 OUTPUT CIRCUIT
41 EMPTY DETERMINATION CIRCUIT

42 GRAY CODE COUNTER
44 REGISTER
100 TEST PATTERN GENERATION DEVICE
101 FIFO
101A FIFO (FUNCTIONAL BLOCK FOR WRITING)
101B, 101C FIFO (FUNCTIONAL BLOCK FOR READING)
102 TEST PATTERN READ DEVICE
103 SYSTEM CONTROLLER
104 MEMORY DEVICE
105 SELECTION CIRCUIT
109 DMA CONTROLLER
110 FIRST CLOCK SIGNAL
200 TEST CONTROL DEVICE
201, 301 CIRCUIT TO BE TESTED
202, 302 TEST RESULT COMPRESSION DEVICE
203, 303 TEST CLOCK CONTROL DEVICE
204 INPUT SELECTION CIRCUIT
205 OUTPUT SELECTION CIRCUIT
206 ARBITRATION CIRCUIT
210 SECOND CLOCK SIGNAL
310 THIRD CLOCK SIGNAL
2000 SCAN SHIFT COUNTER
2001 SCAN SHIFT NUMBER OF TIMES REGISTER
2002 COMPARATOR
2003, 2008, 2009 SELECTOR
2004, 2021, 2022 AND GATE
2005 TEST PATTERN COUNTER
2006 TEST PATTERN NUMBER REGISTER
2007 COMPARATOR
2010 SCAN CHAIN
2011 EXTENSION CIRCUIT
2012, 2023 COMPRESSION CIRCUIT

The invention claimed is:

1. A semiconductor device comprising:
a FIFO (First In First Out);
a test data write circuit connected to the FIFO, the test data write circuit sequentially writes a plurality of test data to the FIFO in synchronization with a first clock signal; and
a test control circuit connected to the test data write circuit, the test control circuit in parallel with writing of the plurality of test data to the FIFO by the test data write circuit, sequentially reads a plurality of test data stored in the FIFO in synchronization with a second clock signal, which is not synchronous with the first clock signal, to perform a scan test of a circuit to be tested,
wherein
the circuit to be tested has a scan chain for performing the scan test, and performs a scan shift operation in synchronization with the second clock signal and thereby reads test data from the FIFO and scans the test data into the scan chain, and scans out test result data stored in the scan chain,
the test data write circuit sequentially writes the plurality of test data and a plurality of mask data respectively corresponding to the plurality of data to the FIFO in synchronization with the first clock signal,
the semiconductor device further includes a test result processing circuit to which the test result data scanned out of the scan chain is input, and
the test result processing circuit includes a mask circuit that, when the test data is scanned into the scan chain, reads mask data corresponding to the test data from the FIFO, and masks, by the read mask data, the test result data to be scanned out when the test data is scanned into the scan chain, and thereby fixes the data to Low or High.

2. The semiconductor device according to claim 1, further comprising:
an empty determination circuit that determines whether the FIFO is empty or not, wherein
when the empty determination circuit determines that the FIFO is not empty, the test control circuit allows reading of test data from the FIFO.

3. The semiconductor device according to claim 2, wherein
when the empty determination circuit determines that the FIFO is empty, the test control circuit stops reading of test data from the FIFO.

4. The semiconductor device according to claim 3, wherein
the test control device further includes a clock control circuit that, when the empty determination circuit determines that the FIFO is empty, stops supply of the second clock signal to the circuit to be tested and thereby stops reading of test data from the FIFO.

5. The semiconductor device according to claim 1, wherein
the mask circuit sequentially outputs the masked test result data, and
the test result processing circuit includes a compression circuit that generates a compressed code based on the test result data sequentially output from the mask circuit.

6. The semiconductor device according to claim 5, wherein
the test control circuit counts the number of test data scanned into the scan chain in synchronization with the second clock signal, and causes the circuit to be tested to perform a capture operation, instead of a scan shift operation, each time the test data corresponding to a size of the scan chain is scanned in.

7. The semiconductor device according to claim 6, wherein
the test control circuit outputs a termination signal when it is determined that all of the plurality of test data are scanned in based on the number of test data scanned into the scan chain, and
the semiconductor device further includes a test result determination circuit that determines a result of a scan test by comparing a compressed code generated by the test result processing circuit with a specified expected value in response to the termination signal output from the test control circuit.

8. The semiconductor device according to claim 1, further comprising:
a full determination circuit that determines whether the FIFO is full or not, wherein
when the full determination circuit determines that the FIFO is full, the test data write circuit stops writing of test data to the FIFO.

9. The semiconductor device according to claim 1, further comprising:
a storage circuit for storing the plurality of test data, wherein
the test data write circuit sequentially writes the plurality of test data stored in the storage circuit to the FIFO.

10. The semiconductor device according to claim 9, further comprising:
a test data acquisition circuit that acquires the plurality of test data from an external storage device connected to the semiconductor device, and stores the plurality of test data into the storage circuit.

11. The semiconductor device according to claim 1, wherein
the semiconductor device includes a plurality of circuits to be tested and a plurality of test control circuits that perform a scan test of each of the plurality of circuits to be tested, and
the semiconductor device further includes
a test instruction circuit that gives an instruction to perform a scan test of any two or more circuits to be tested among the plurality of circuits to be tested, and
an arbitration circuit that gives an instruction to perform the scan test to two or more test control circuits corresponding to the two or more circuits to be tested specified by the test instruction circuit.

12. A semiconductor device comprising,
a FIFO (First In First Out);
a test data write circuit connected to the FIFO the test data write circuit sequentially writes a plurality of test data to the FIFO in synchronization with a first clock signal; and
a test control circuit connected to the test data write circuit, the test control circuit in parallel with writing of the plurality of test data to the FIFO by the test data write circuit, sequentially reads a plurality of test data stored in the FIFO in synchronization with a second clock signal, which is not synchronous with the first clock signal, to perform a scan test of a circuit to be tested,
wherein
the semiconductor device includes a plurality of circuits to be tested,
each of the plurality of circuits to be tested has a scan chain for performing the scan test, and performs a scan shift operation in synchronization with the second clock signal and thereby scans the test data read by the test control circuit into the scan chain, and
the semiconductor device further includes an input selection circuit that selects a circuit to be tested specified by the test control circuit from the plurality of circuits to be tested as a circuit to which the test data read from the FIFO is to be input.

13. The semiconductor device according to claim 12, wherein
each of the plurality of circuits to be tested scans out test result data stored in the scan chain, in addition to scanning in the test data, and
the semiconductor device further includes
a test result processing circuit to which the test result data scanned out of the scan chain is input, and
an output selection circuit that selects a circuit to be tested specified by the test control circuit from the plurality of circuits to be tested as a circuit from which the test result data is to be output to the test result processing circuit.

14. A semiconductor device comprising:
a FIFO (First In First Out);
a test data write circuit connected to the FIFO, the test data write circuit sequentially writes a plurality of test data to the FIFO in synchronization with a first clock signal; and
a test control circuit connected to the test data write circuit, the test control circuit in parallel with writing of the plurality of test data to the FIFO by the test data write circuit, sequentially reads a plurality of test data stored in the FIFO in synchronization with a second clock signal, which is not synchronous with the first clock signal, to perform a scan test of a circuit to be tested,
wherein
the circuit to be tested is a first circuit to be tested,
the test control circuit is a first test control circuit, and
the semiconductor device further includes
a second test control circuit that, in parallel with writing of the plurality of test data to the FIFO by the test data write circuit, sequentially reads a plurality of test data stored in the FIFO in synchronization with a third clock signal, which is not synchronous with the first clock signal and the second clock signal, and performs a scan test of a second circuit to be tested, and
a selection circuit that selects any one of the first test control circuit and the second test control circuit as a test control circuit to perform the scan test.

15. The semiconductor device according to claim 14, further comprising:
a first empty determination circuit and a second empty determination circuit that determine whether the FIFO is empty or not, wherein
when the first empty determination circuit determines that the FIFO is not empty, the first test control circuit allows reading of test data from the FIFO,
when the second empty determination circuit determines that the FIFO is not empty, the second test control circuit allows reading of test data from the FIFO, and
the selection circuit selects any one of the first empty determination circuit and the second empty determination circuit as an empty determination circuit to determine whether the FIFO is empty or not, and thereby causes one of the first test control circuit and the second test control circuit to perform the scan test.

* * * * *